US012693340B2

(12) United States Patent
Liu et al.

(10) Patent No.: US 12,693,340 B2
(45) Date of Patent: Jul. 28, 2026

(54) BATTERY CAPACITY CONTROLLER FOR MULTIPLE PORTABLE POWER STATIONS

(71) Applicant: Queen's University at Kingston, Kingston (CA)

(72) Inventors: Yan-Fei Liu, Kingston (CA); Binghui He, Kingston (CA); Yang Chen, Hefei (CN); Bo Sheng, Kingston (CA)

(73) Assignee: Queens's University at Kingston, Kingston (CA)

( * ) Notice: Subject to any disclaimer, the term of this patent is extended or adjusted under 35 U.S.C. 154(b) by 803 days.

(21) Appl. No.: 18/079,129

(22) Filed: Dec. 12, 2022

(65) Prior Publication Data

US 2024/0012057 A1 Jan. 11, 2024

Related U.S. Application Data

(60) Provisional application No. 63/388,069, filed on Jul. 11, 2022.

(51) Int. Cl.
| | |
|---|---|
| *G01R 31/3828* | (2019.01) |
| *H01M 10/42* | (2006.01) |
| *H02J 7/00* | (2026.01) |
| *H02J 7/34* | (2006.01) |
| *H02J 7/50* | (2026.01) |

(52) U.S. Cl.
CPC ...... *G01R 31/3828* (2019.01); *H01M 10/425* (2013.01); *H02J 7/342* (2020.01); *H02J 7/585* (2026.01); *H02J 7/855* (2026.01); *H01M 2010/4271* (2013.01); *H01M 2010/4278* (2013.01)

(58) Field of Classification Search
CPC .... G01R 31/3828; H03J 7/0025; H03J 7/342; H03J 7/0063; H01M 10/425; H01M 2010/4271; H01M 2010/4278; H02J 7/0025; H02J 7/342; H02J 7/0063

USPC .......................................................... 702/63
See application file for complete search history.

(56) References Cited

U.S. PATENT DOCUMENTS

| | | | | |
|---|---|---|---|---|
| 12,081,023 B2 * | 9/2024 | Liu | .......................... | H02J 3/007 |
| 2015/0091392 A1 * | 4/2015 | Hwang | .................. | H02J 7/0045 |
| | | | | 307/150 |
| 2023/0420939 A1 * | 12/2023 | Liu | .......................... | H02J 7/342 |

FOREIGN PATENT DOCUMENTS

| | | | | |
|---|---|---|---|---|
| CA | 3184632 A1 * | 1/2024 | .............. | H02J 3/007 |

* cited by examiner

*Primary Examiner* — Michael P Nghiem
(74) *Attorney, Agent, or Firm* — Stephen J. Scribner

(57) ABSTRACT

Methods and controllers manage battery capacities of two or more portable power station (PPS) units connected together in a parallel arrangement to produce a total output current, wherein a first PPS unit operates as a voltage source and each of a second or more PPS unit operates as a current source. Each PPS unit communicates with a battery capacity controller (BCC) wherein each PPS transmits a battery capacity measure to the BCC at selected time intervals. The BCC uses the battery capacity measures to implement a battery capacity control strategy that determines the amount of output current each of the second or more PPS units contributes to the total output current at each time interval. The BCC transmits a control coefficient to each of the second or more PPS units corresponding to the determined amount of output current to be produced by each of the second or more PPS units.

19 Claims, 15 Drawing Sheets

BATTERY CAPACITY CONTROLLER FOR MULTIPLE PORTABLE POWER STATIONS

RELATED APPLICATION

This application claims the benefit of the filing date of Application No. 63/388,069, filed on Jul. 11, 2022, the contents of which are incorporated herein by reference in their entirety.

FIELD

This invention relates to portable power stations. More specifically, the invention relates to controllers that manage battery usage of two or more portable power stations connected in parallel.

BACKGROUND

A portable power station (PPS) uses a battery as a power source. It converts a DC battery voltage into an AC voltage (e.g., 220V, 50 Hz AC voltage in Europe, China; 120V, 60 Hz AC voltage in North America). Depending on the power rating and energy storage requirement, the battery voltage is normally between 20V to 40V. In order to reduce the cost and to reduce the battery re-charging time, a bi-directional inverter is used in the PPS.

During battery discharging operation, the bi-directional inverter operates at inverter mode to convert the battery DC voltage (such as 20V) into AC voltage, such as 120 VAC. During battery re-charging operation, the PPS is connected to an external AC power source and the external AC voltage charges the battery. In this case, the bi-directional inverter operates at rectifier mode.

Multiple PPS units can be connected in parallel to achieve two objectives: (1) provide higher output power; (2) provide longer battery life. Sometimes, both objectives are combined. However, there are drawbacks with current approaches.

SUMMARY

According to one aspect of the invention there is provided a portable power station (PPS) apparatus, comprising: two or more PPS units, the two or more PPS units connected together in a parallel arrangement to produce a total output current, wherein a first PPS unit operates as a voltage source and each of a second or more PPS unit operates as a current source; a battery capacity controller (BCC); wherein each PPS unit of the two or more PPS units is configured to communicate with the BCC; wherein each PPS transmits information including a battery capacity measure to the BCC at selected time intervals; wherein the BCC uses the battery capacity measure of each PPS unit to implement a selected battery capacity control strategy that determines the amount of output current each of the second or more PPS unit contributes to the total output current at each selected time interval; and the BCC transmits a control coefficient to each of the second or more PPS units corresponding to the determined amount of output current to be produced by each of the second or more PPS units.

According to another aspect of the invention there is provided a battery capacity controller (BCC) for a portable power station (PPS) apparatus comprising two or more PPS units, the two or more PPS units connected together in a parallel arrangement to produce a total output current, wherein a first PPS unit operates as a voltage source and each of a second or more PPS unit operates as a current source; wherein each PPS transmits information including a battery capacity measure to the BCC at selected time intervals; wherein the BCC uses the battery capacity measure of each PPS unit to implement a selected battery capacity control strategy that determines the amount of output current each of the second or more PPS unit contributes to the total output current at each selected time interval; and the BCC transmits a control coefficient to each of the second or more PPS units corresponding to the determined amount of output current to be produced by each of the second or more PPS units.

In one embodiment, the BCC may be implemented at least in part in computer-executable instructions stored on non-transitory computer-readable storage media.

In one embodiment, the BCC may be implemented on a remote processing device that executes the computer-executable instructions stored on non-transitory computer-readable storage media.

In one embodiment, the BCC may implement at least one battery capacity control strategy selected from a battery balancing controller (BBC), a battery extension controller (BXC), and a battery balancing and extension controller (BBXC).

In one embodiment, the battery capacity control strategy may be selectable.

In one embodiment, transmission of information from each PPS to the BCC and transmission of the control coefficient from the BCC to each PPS may be performed wirelessly.

In one embodiment, the wireless transmission may comprise Bluetooth or Wi-Fi.

In one embodiment, the output current of a selected one of the second or more PPS units is controlled to be higher than, lower than, or equal to an average output current of all the PPS units.

In one embodiment, a battery capacity of each PPS unit is substantially the same at a selected time interval.

In one embodiment, a battery capacity of a selected PPS unit is depleted before the battery capacity of remaining PPS units is depleted.

In one embodiment, the battery capacities of each of the two or more PPS units are maintained according to a pre-determined relationship.

According to another aspect of the invention there is provided non-transitory computer readable media for use with a processor, the computer readable media having stored thereon instructions that direct the processor to execute processing steps including implementing a battery capacity controller (BCC), wherein the BCC: receives information including a battery capacity measure from two or more PPS units at selected time intervals; uses the battery capacity measure of each PPS unit to determine the amount of output current each of a second or more PPS unit contributes to a total output current of the two or more PPS units at each selected time interval; and transmits a control coefficient to each of the second or more PPS units corresponding to the determined amount of output current to be produced by each of the second or more PPS units.

In one embodiment of the non-transitory computer readable media the BCC implements at least one battery capacity control strategy selected from a battery balancing controller (BBC), a battery extension controller (BXC), and a battery balancing and extension controller (BBXC).

In one embodiment of the non-transitory computer readable media the battery capacity control strategy is selectable.

According to another aspect of the invention there is provided a method for controlling a portable power station (PPS) apparatus, wherein the PPS apparatus comprises two or more PPS units, the two or more PPS units connected together in a parallel arrangement to produce a total output current, wherein a first PPS unit operates as a voltage source and each of a second or more PPS unit operates as a current source, the method comprising: implementing a battery capacity controller (BCC) on a processing device; transmitting information including a battery capacity measure from each PPS unit to the BCC at selected time intervals; the BCC using the battery capacity measure of each PPS unit to implement a selected battery capacity control strategy that determines the amount of output current each of the second or more PPS unit contributes to the total output current at each selected time interval; and the BCC transmitting a control coefficient to each of the second or more PPS units corresponding to the determined amount of output current to be produced by each of the second or more PPS units.

In one embodiment of the method, the BCC is implemented at least in part in computer-executable instructions stored on non-transitory computer-readable storage media.

In one embodiment of the method, the BCC implements at least one battery capacity control strategy selected from a battery balancing controller (BBC), a battery extension controller (BXC), and a battery balancing and extension controller (BBXC).

In one embodiment of the method, the battery capacity control strategy is selectable.

In one embodiment of the method, the output current of a selected one of the second or more PPS units is controlled to be higher than, lower than, or equal to an average output current of all the PPS units according to the selected battery capacity control strategy.

In one embodiment of the method, a battery capacity of each PPS unit is substantially the same at a selected time interval.

In one embodiment of the method, a battery capacity of a selected PPS unit is depleted before the battery capacity of remaining PPS units is depleted.

In one embodiment of the method, the battery capacities of each of the two or more PPS units are maintained according to a pre-determined relationship.

BRIEF DESCRIPTION OF THE DRAWINGS

For a better understanding of the invention, and to show more clearly how it may be carried into effect, embodiments will be described, by way of example, with reference to the accompanying drawings, wherein.

DETAILED DESCRIPTION OF EMBODIMENTS

Figures 1, 2:
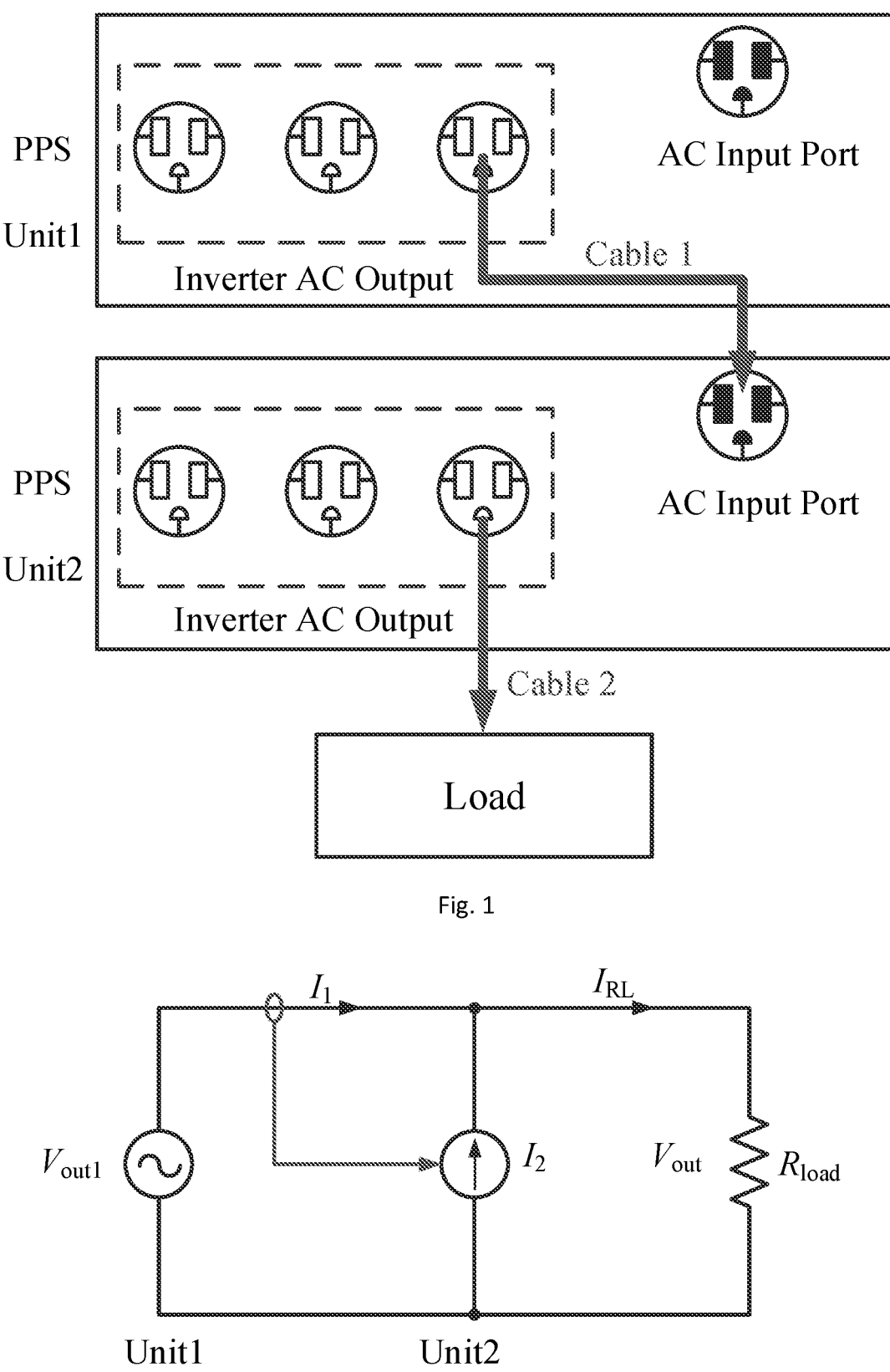
FIG. 1 is a diagram showing face plate connections of two portable power stations connected in parallel, according to one embodiment.
FIG. 2 is a schematic diagram of an equivalent circuit of the parallel operation of the two PPS units of FIG. 1, according to one embodiment.

As an illustrative example, it is assumed that the output power of one PPS unit is 600 W and its battery can last for 1 hour when providing 600 W load to a load. In some applications, two PPS units are connected in parallel to provide 1,200 W for one hour. In other applications, four PPS units are connected in parallel to provide 2,400 W for one hour.

In other applications, 600 W may be required for two hours. This requirement can be satisfied with two 600 W PPS connected in parallel and the battery capacity of each PPS is controlled in one of the following ways:

(1) One PPS provides 600 W power for the first hour until its battery is depleted and then the second PPS will provide the 600 W load for the second hour.

(2) Each PPS provides 300 W power and the batteries will last for two hours.

(3) The first PPS unit provides 200 W power and the second PPS unit provides 400 W power. When the battery in the second PPS unit is depleted, the first PPS unit will provide 600 W power to the load.

In all the above cases, the two PPS units provide 600 W for two hours.

The above example shows the need and benefit of controlling the relative value of the remaining battery capacity of different PPS units in a paralleled PPS system. A Battery Capacity Controller (BCC) according to embodiments described herein may be implemented to achieve battery capacity control features when two or more PPS units are connected in parallel, such as, for example:

(1) Balancing the battery capacity: Making the battery capacity of each PPS unit the same even when the initial battery capacities are different from each other.

(2) Extending the battery capacity: Making the battery capacity in one PPS unit as high as possible while depleting the battery capacity in other PPS units.

(3) Combination of the above: controlling the battery capacity of multiple PPS units according to a desired relationship. For example, the battery capacity in the first PPS unit is always 10% more than the second PPS unit.

Described herein are methods and circuits that may be implemented to control the remaining battery capacity of each PPS unit when multiple PPS units are connected in parallel. Throughout this description the terms "control" and "controller" may be used interchangeably.

As used herein, the terms "battery capacity" and "remaining battery capacity" are used interchangeably unless otherwise specified, and refer to the battery capacity available for use. For example, 50% battery capacity means that half of the battery capacity is available for discharging.

As used herein, the terms "PPS unit 1 (or 2, 3, etc.)", "unit 1 (or 2, 3, etc.)", and "inverter 1 (or 2, 3, etc.)" are used interchangeably unless otherwise specified. For example, the terms "output voltage of PPS unit 1", "output voltage of unit 1", and "output voltage of inverter 1" are considered to be equivalent. Similarly, the terms "output current of PPS unit 1", "output current of unit 1", and "output current of inverter 1" are considered to be equivalent.

As used herein, the term "substantially" as used with respect to a value or condition refers to a value or condition that is the same as, or close to a desired or selected value or condition, as may be achieved within tolerances of circuit components, control parameters, etc. By using the term "substantially" it is understood that a recited characteristic, parameter, and/or value need not be achieved exactly, but that deviations or variations, including for example, tolerances, measurement error, measurement accuracy limitations and other factors known to those of ordinary skill in the art, may occur in amounts that do not preclude the effect the characteristic, parameter, and/or value was intended to provide. A characteristic, parameter, and/or value that is substantially absent (e.g., substantially removed, substantially zero) may be one that is within the noise, beneath background, below detection limits, or a small fraction (e.g., <1%, <0.1%, <0.01%, <0.001%, <0.00001%, <0.000001%, <0.0000001%) of the significant characteristic. It is understood that a characteristic, parameter, and/or value that is referred to herein as being the "same" as another characteristic, parameter, and/or value may be substantially the same as the other characteristic, parameter, and/or value.

FIG. 1 shows a connection block diagram when two PPS units connected in parallel to provide more power to a load. The output voltage of inverter 1 (of the first PPS unit) is connected to the AC input port of the second PPS unit. The load is connected to the inverter output port of the second PPS unit.

An equivalent electrical circuit diagram of the two PPS units connected in parallel is shown in FIG. 2. The output voltage of PPS 1 is an AC voltage source. The inverter in PPS unit 2 operates as an AC current source. The load current is the sum of both PPS 1 output current and PPS 2 output current.

PPS unit 2 operates as an AC current source. It produces an AC current, I2, that is same as the output current of PPS unit 1, I1. The output current of PPS unit 1, I1, is sensed in PPS unit 2, and serves as a reference current for inverter 2 so that I2 is controlled to be same as I1, as shown in the equation below:

$$Iref2=I1, \text{ and therefore, } I2=Iref2=I1 \qquad (1)$$

In the above equation, Iref2 is the reference current for inverter 2 and I1 is the output current of inverter 1. The output current of inverter 2 (of PPS 2) is forced to follow the output current of inverter 1 (of PPS 1). Therefore, the two currents are the same.

Figure 3:
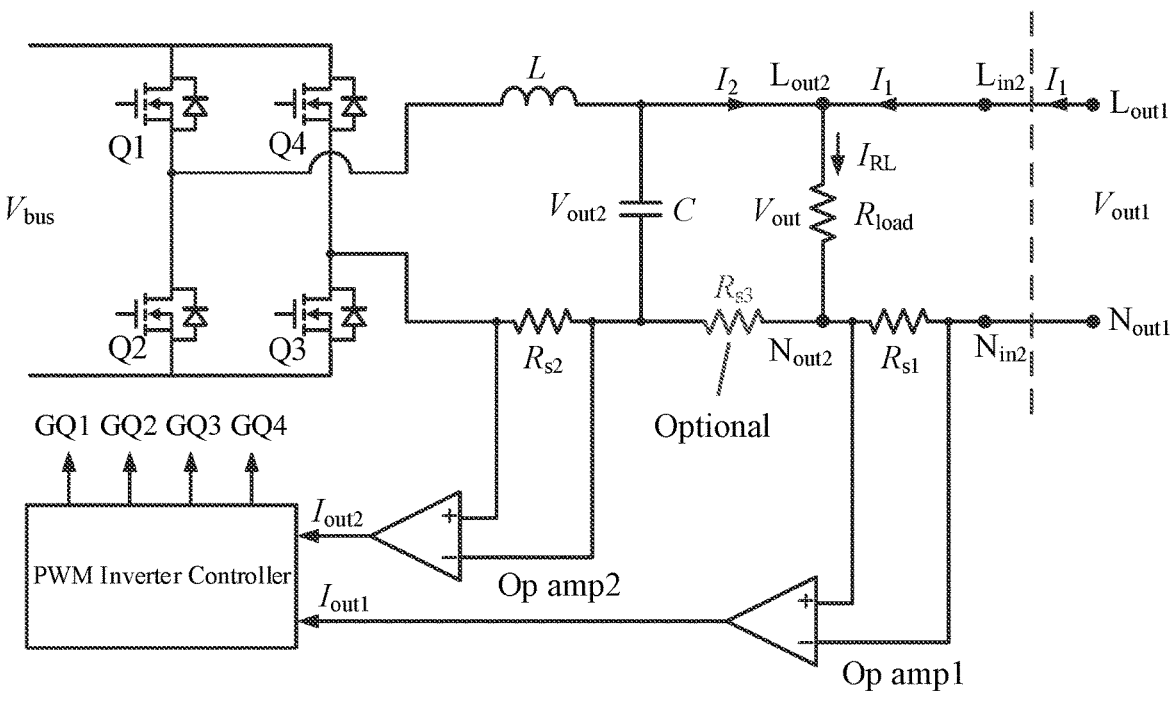
FIG. 3 is a diagram of an implementation of a PPS, according to one embodiment.

FIG. 3 shows an implementation circuit according to one embodiment. Lout1 and Nout1 are inverter 1 output terminals. They are connected to the AC input port of PPS unit 2, as indicated by terminals Lin2, Nin2. A load resistor Rload is connected at the inverter 2 output terminals, Lout2 and Nout2. The inverter 1 output current, I1, is sensed by current sensing resistor, Rs1, and is then amplified to generate, Iout1, that is proportional to I1. Iout1 is used as a reference current for inverter 2 so that inverter 2 behaves as an AC current source and produce a same output current as I1, i.e., I2=I1.

It is noted that I1 and I2 are both sinusoidal current in practical application. Of course, they may also be other shapes of waveforms. It is assumed in this specification that sinusoidal voltage and current are generated.

It is noted that PPS unit 1 and PPS unit 2 are connected physically by cable 1, as shown in FIG. 1. Cable 1 has two conductors corresponding to Lout1 and Nout1. No other physical connection between PPS unit 1 and PPS unit 2 is required, according to embodiments.

Each PPS unit includes an inverter controller, e.g., a PWM inverter controller as shown in FIG. 3, to control operation of the PPS unit, which may include current sensing and generation of current reference signals, and to generate gate drive signals for switches of the inverter. The switches, e.g., Q1-Q4 of FIG. 3, may be implemented with MOSFETs, IGBTs, etc.

The inverter controller of each PPS unit may include an electronic processor and a memory. The processor may be, for example, a digital controller such as a microcontroller unit (MCU). The processor may include processing capabilities as well as an input/output (I/O) interface through which the processor may receive a plurality of input signals (e.g., current sensing signals, operation mode (voltage or current source) signals) and generate a plurality of output signals (e.g., gate drive signals for switches of a DC-AC inverter or a bi-directional inverter). The memory is provided for storage of data and instructions or code (i.e., an algorithm, such as a controller algorithm, controller logic, software, etc.) executable by the processor. The memory may include various forms of non-volatile (i.e., non-transitory) memory including flash memory or read only memory (ROM) including various forms of programmable read only memory (e.g., PROM, EPROM, EEPROM) and/or volatile memory including random access memory (RAM) including static random access memory (SRAM), dynamic random access memory (DRAM) and synchronous dynamic random access memory (SDRAM). Each PPS unit may also include a driver circuit or device to interface between outputs of the controller and the gate terminals of the semiconductor switches.

The memory stores executable code including control logic which is configured to control the overall operation of a PPS unit in accordance with a desired control strategy. For example, the control logic, when executed by the processor, is configured to generate, in response to one or more input signals, the various gate drive signals for the switches of the inverter. The control logic may include programmed logic blocks to implement specific functions, for example, including without limitation, zero crossing detection, error amplifier, pulse width modulation (PWM), power factor correction (PFC), zero voltage switching (ZVS), rms current calculator, operating mode control (current source, voltage source) logic, and startup and/or shut down strategy. The memory may also store, e.g., a sinusoidal lookup table that may be accessed by the control logic. Non-limiting examples of control strategies, or parts thereof, that may be implemented separately or in various combinations in controllers according to embodiments described herein are shown in FIGS. 4B, 5B, 6B, 12B, 12C, and 12D.

Three examples of a Battery Capacity Controller (BCC) are described in detail below, and include a Battery Balancing Control (BBC) strategy, a Battery Extension Control (BXC) strategy, and a combined Battery Balancing and Extension Control (BBXC) strategy.

Typically there is no direct communication or information exchange between PPS units. Instead, the PPS units communicate with a BCC. Accordingly, to facilitate implementation of a BCC and reduce complexity of a multiple PPS system, a BCC may be implemented remotely. For example, a BCC may be implemented, at least in part, in a software application (i.e., an APP) running on a device such as a smartphone, tablet, computer, server, etc. Communication between each PPS unit and the BCC may be achieved wirelessly, e.g., by Bluetooth®, WiFi, LTE, etc. The APP may allow a battery control strategy, such as a strategy based on BBC, BXC, or BBXC, to be selected and used with the PPS units. In some embodiments a BCC may be implemented on a device in close proximity to the PPS units, in which case the PPS units may communicate with the BCC over a wired connection. In some embodiments a BCC may be implemented in a PPS unit, in which case other PPS units communicate with the PPS unit implementing the BCC.

The inverter controller may be configured to interface with the BCC APP running remotely on a processing device such as a smart phone, tablet, computer, server, etc., and may be configured for wireless communications with the remote processing device, with hardware including a transmitter/receiver module for a communications platform such as, e.g., WiFi, Bluetooth®, 3G/4G/5G long term evolution (LTE), etc. In embodiments described herein Bluetooth is used as a non-limiting example of a format of wireless communication between PPS units and a remote device.

Each PPS unit may include a Battery Management System (BMS). The BMS may be implemented in the inverter controller, or it may be implemented separately. The BMS may provide various functions, including protecting the battery from over voltage, under voltage, over current, over temperature, and under temperature, and estimating the remaining battery capacity. The BMS may conveniently be implemented with a commercially available integrated circuit device such as BQ27Z746 Impedance Track™ Technology Battery Gas Gauge and Protection Solution (Texas Instruments, Dallas, Texas, USA) for lithium-ion batteries, or a similar device for other types of batteries. The BMS may communicate information indicative of battery capacity to the BCC APP.

As described for various embodiments and shown throughout the figures, a BCC controls the amount of output current produced by a PPS unit j, wherein j=2, 3, 4, . . . , n, by sending one or more control signal (e.g., KCn) to the inverter controller of each PPS unit j.

The APP may also allow a user to control power on/off of PPS units as well as certain features of their operation, such as, for example, the designation of PPS units as unit 1, unit 2, etc., corresponding operation as a voltage source or current source, and the APP may provide an interface on the display screen of the device indicating status of the PPS units, such as, for example, which PPS unit is operating as a voltage source and which PPS unit(s) is/are operating as a current source, and the current battery capacity of each PPS unit.

Thus, according to some embodiments a BCC may be implemented in computer code, i.e., computer-executable instructions, software program, an APP, etc., executable by a processing device such as a smart phone, tablet, computer, server, etc., or network of computing devices. The computer code may be stored on a non-transitory computer-readable storage medium, i.e., storage hardware, non-transitory storage device, or non-transitory computer system memory, etc. that may be accessed by a controller, a microcontroller, a microprocessor, etc., generally referred to herein as a "processor". Accessing the computer-readable medium may include the processor retrieving and/or executing the computer-executable instructions encoded on the storage medium, which may include the processor running the APP on the device. The non-transitory computer-readable medium may include, but is not limited to, one or more types of hardware memory, non-transitory tangible media (for example, one or more magnetic storage disks, one or more optical disks, one or more USB flash drives), computer system memory or random access memory (such as, DRAM, SRAM, EDO RAM) and the like. Executing the stored instructions may enable the device to carry out processing steps in accordance with embodiments described herein, for example, processing steps corresponding to an algorithm such as that shown in the embodiments of FIGS. 4B, 5B, 6B, 12B, 12C, and 12D and/or one or more features described with respect to FIGS. 4B, 5B, 6B, 12B, 12C, and 12D, and may include prompting a user for input.

1. Battery Balancing Controller (BBC), Two PPS Units in Parallel

The BBC strategy is used to make the remaining battery capacity of each PPS unit that is connected in parallel to be the same a certain time after the BBC is activated. In one embodiment, the strategy is to make the PPS unit with higher battery capacity produce higher current than the other PPS units.

Figure 4A:
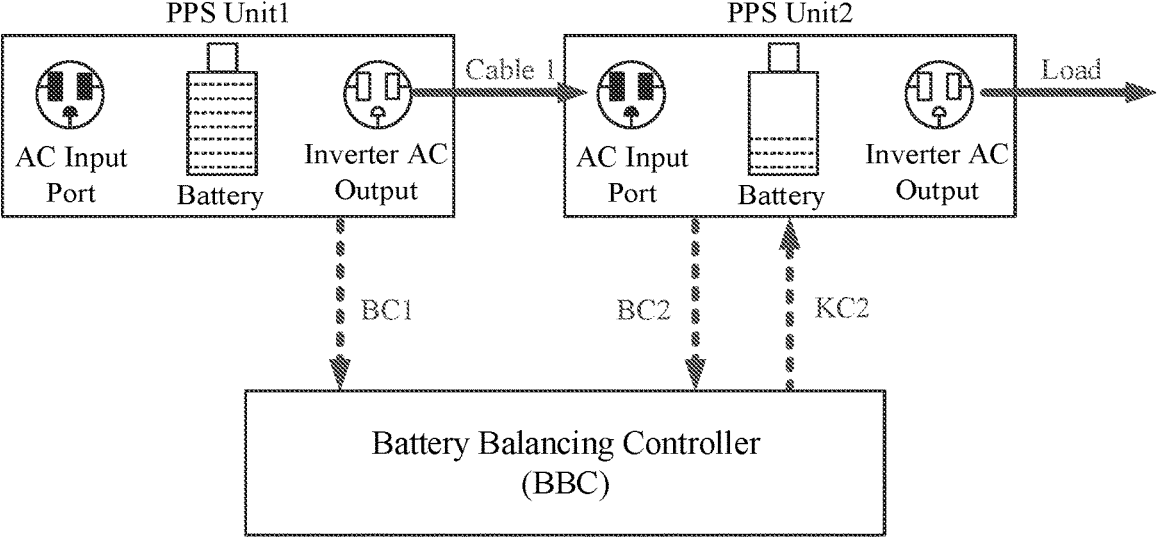
FIG. 4A is a block diagram showing a battery balancing controller for two PPS units connected in parallel, according to one embodiment.

FIG. 4A is a diagram showing the BBC strategy implemented for two PPS units connected in parallel, according to one embodiment. The control strategy may be extended to three or more PPS units connected in parallel. The AC output of PPS unit 1 is applied to the AC input port of PPS unit 2 and the inverter output of PPS unit 2 is connected to load.

Figure 4B:
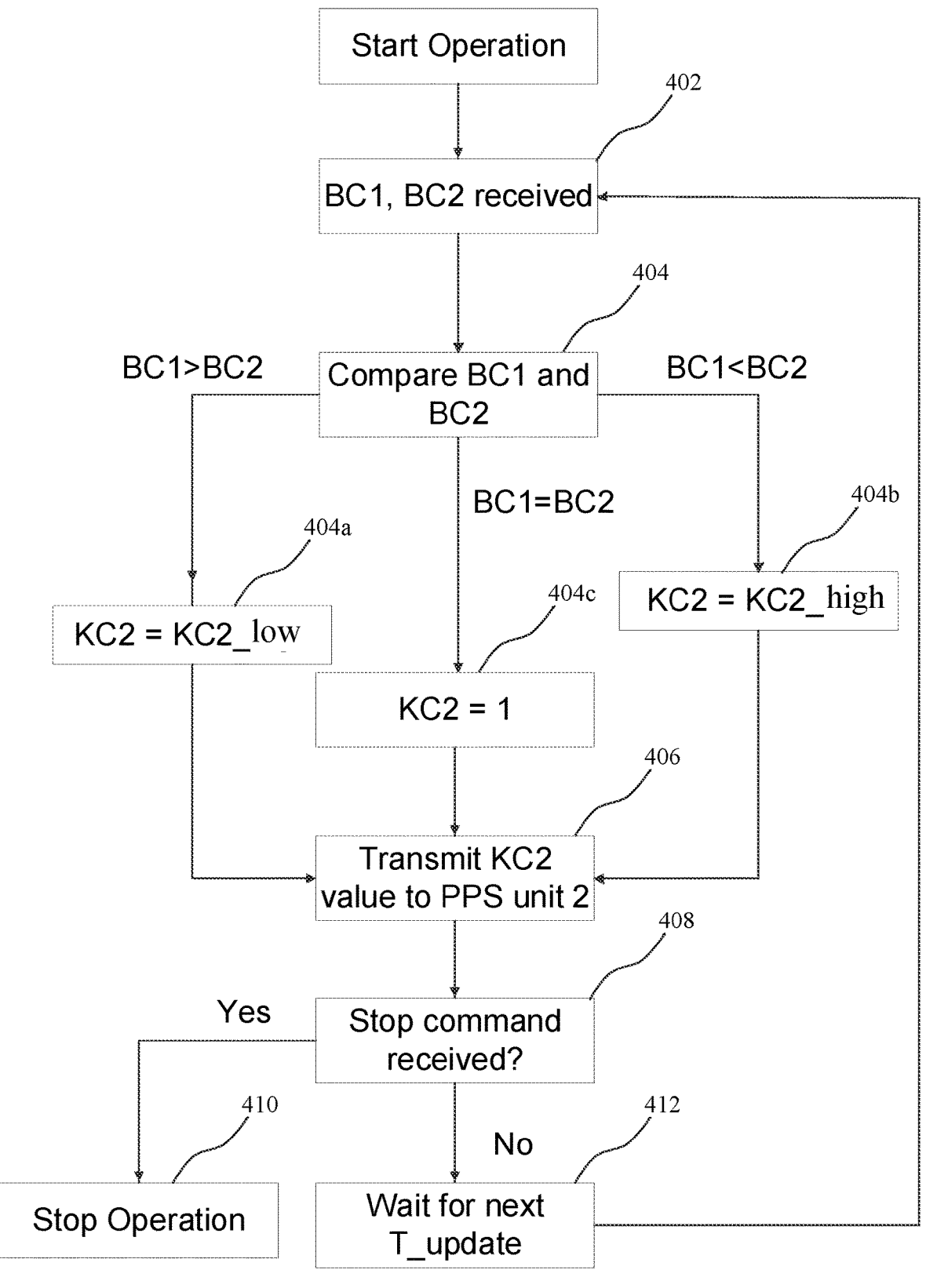
FIG. 4B is a flow chart for a battery balancing controller, according to one embodiment.

In one embodiment the BBC strategy is implemented in an APP running on a remote processing device, as discussed above. Each PPS unit communicates with the BBC, and the BBC controls the output power of each of the second or more PPS unit(s) so that the PPS unit with higher battery capacity will produce more power than the PPS unit with lower battery capacity. A flowchart of a BBC strategy according to one embodiment is shown in FIG. 4B.

A time interval referred to herein as "update interval" is defined, T_update. The remaining battery capacity of each PPS unit, which may be determined according to a battery capacity estimation circuit, is sent (i.e., transmitted, communicated) to the BBC in each T_update. It is assumed that the remaining battery capacity of each PPS is transferred to BBC at the beginning of T_update. BC1 is the remaining battery capacity of PPS unit 1. BC2 is the remaining battery capacity of PPS unit 2.

Therefore, it is assumed that BC1_0 indicates the remaining battery capacity of PPS unit 1 at the beginning of the battery balancing operation. BC1_n indicates the remaining battery capacity of PPS unit 1 at the nth update cycle, T_update_n. Similarly, BC2_n indicates the remaining battery capacity of PPS unit 2 at the nth update cycle, T_update_n.

In general, considering that (1) the battery discharges gradually, (2) Bluetooth transmission time is not fast, (between 50 millisecond and 500 millisecond), and (3) the PPS will deplete the battery in about 1 hour (60 minutes) when it is discharged at full load, the time length of T_update may be set to, e.g., between 5 seconds to 1 minute. Other values of T_update can also be selected. Generally, T_update should be selected between 0.1% to 1% of the total discharging time when the PPS unit is producing full load power. For example, if the battery of a PPS unit will be completely discharged at 600 W (max load power) in 60 minutes, it is desired to set the T_update from 3.6 seconds (0.1% of 60 minutes) to 36 seconds (1% of 60 minutes).

At the beginning of each T_update, the remaining battery capacity of PPS unit 1 (BC1) and PPS unit 2 (BC2) is transmitted to the BBC (e.g., via Bluetooth). Based on the relative values of BC1 and BC2, BBC will transmit a current control coefficient, KC2, to the inverter controller of PPS unit 2 (e.g., the PWM inverter controller as shown in the embodiment of FIG. 3). It is noted that PPS unit 2 produces an AC current source. KC2 is used to control the output current of PPS unit 2 relative to the output current of PPS unit 1.

$$I2=Iref2=KC2*I1 \tag{2}$$

If at the beginning of battery balancing operation, PPS unit 1 has higher battery capacity than PPS unit 2 then PPS unit 1 provides more current to the load than PPS unit 2. That is, PPS unit 2 should produce a lower current. This can be achieved by:

$$I2=Iref2=KC2\_low*I1 \tag{3}$$

In the above equation, KC2 low is a value between 0 and 1. For example, if KC2 low=0.5, then the output current of PPS unit 2 is half of the output current of PPS unit 1, I2=0.5*I1. The battery of PPS unit 1 discharges at two-times the rate as compared with the battery in PPS unit 2. If KC2 low=0, then I2=0*I1=0. The battery of PPS unit 2 does not discharge at all. All the load current comes from PPS unit 1 since load current, IR=I1+I2.

With the control strategy of equation (3), the output current of PPS unit 2 is lower than the output current of PPS unit 1 and therefore the battery in PPS unit 1 discharges more quickly than the battery in PPS unit 2. After some period, the remaining battery capacity in both PPS units will be same.

If PPS unit 2 has higher battery capacity than PPS unit 1, then, PPS unit 2 should provide more current to the load than PPS unit 1. That is, PPS unit 2 should produce a higher current. This can be achieved by:

$$I2=Iref2=KC2\_high*I1 \tag{4}$$

In the above equation, KC2_high is a numerical value larger than 1. For example, if KC2_high=2, then the output current of PPS unit 2 is two times the output current of PPS unit 1, I2=2*I1. The battery of PPS unit 2 discharges at two times the rate as compared with the battery in PPS unit 1. If KC2_high=10, then I2=10*I1. The battery of PPS unit 2 will discharge 10 times faster than the battery of PPS unit 1.

It is also noted that another limitation factor is the maximum output power (output current) of each PPS unit. For example, if the maximum output power is 600 W at 220 VAC, then the maximum output current of each PPS unit is 2.7A. This limitation should be considered in PPS unit 2. The actual current reference of PPS unit 2 should be selected so that neither PPS unit 1 nor PPS unit 2 will operate at over current condition.

For example, in the case when the remaining battery capacity of PPS unit 2 is less than the remaining battery capacity of PPS unit 1, BC2<BC1, equation (3) should be used. The actual reference current should be the larger value of the following two values:

$$Iref2\_low\_1=KC2\_low*I1 \tag{5.1}$$

$$Iref2\_low\_2=2*I1\_max-IR,IR=(n-1)+I2\_(n-1) \tag{5.2}$$

$$Iref2\_low=max(Iref2\_1,Iref2\_2) \tag{5.3}$$

In the above equations, I1_max is the max current of each PPS unit. It is assumed that I1_max=I2 max. IR is the load current. Since the load current could change at any time, it is estimated approximately as the sum of PPS unit 1 output current and PPS unit 2 output current of the previous line cycle, as indicated by (n−1). Equation (5.3) means that the actual reference current for PPS unit 2 should be the larger value of Iref2_low_1 and Iref2_low_2.

Similarly, if BC2>BC1, equation (4) should be used. The actual reference current for PPS unit 2 should be the smaller value of the following two values:

$$Iref2\_high\_1=KC2\_high*I1 \tag{6.1}$$

$$Iref2\_high\_2=I2\_max \tag{6.2}$$

$$Iref2\_high=min(Iref2\_high\_1,Iref2\_high\_2) \tag{6.3}$$

The following are noted:

(1) Actual reference current for PPS unit 2, equation (5) and (6) will be decided at the inverter controller. It will not be decided at the BBC controller. The BBC controller provides the relative current value of I2 and I1.

(2) For the purpose of this description, it is assumed that the reference current calculated by equation (5.1) or equation (6.1) does not cause over current condition for any of the PPS units in parallel.

(3) For a PPS unit producing an AC sinusoidal current, Iref2 refers to the instantaneous sinusoidal current. It can also refer to the rms value of the previous line cycle. It can also refer to a combination of other values, such as the average value of previous line cycle's rms value of PPS unit 1 output current and PPS unit 2 output current.

(4) For the purpose of this description, it is assumed that all the current and voltage symbols refer to instantaneous sinusoidal values.

The following describes in detail a battery balancing control strategy according to one embodiment, with reference to FIG. 4B.

Step 1: At the beginning of the battery balancing operation, T_update_0, the remaining battery capacity of PPS unit 1, BC1_0, and the remaining battery capacity of PPS unit 2, BC2_0, are transmitted to the BBC at 402.

Step 2: The BBC compares the values of BC1_0 and BC2_0 at 404.

Step 2.1: If the relationship between BC1_0 and BC2_0 is:

$$BC1\_0 > BC2\_0 \qquad (6)$$

The above relationship means that the remaining battery capacity of PPS unit 1 is higher than the remaining battery capacity of PPS unit 2, then at 404a the BBC sends the current control coefficient, KC2 low to the inverter controller of PPS unit 2, and the output current of PPS unit 2 is: I2=Iref2=KC2_low*I1. The output current of PPS unit 2 will be lower than the output current of PPS unit 1 and therefore, the battery in PPS unit 2 discharges more slowly than the battery in PPS unit 1. The value of KC2_low is between 0 and 1. As an example, KC2_low=0.5 may be used. In this case, I2=0.5*I1. One-third of the load current is delivered by PPS unit 2 and two-thirds of load current is delivered by PPS unit 1.

In another embodiment, the value of KC2_low can be decided based on the difference between the BC1_0 and BC2_0:

$$Delta\_BCL\_0 = BC1\_0 - BC2\_0 \qquad (7)$$

If Delta BCL_0 is large, e.g., larger than about 20%, a smaller KC2_low value, such as KC2_low=0.25, can be used so that less power is produced by PPS unit 2 and more power is produced by PPS unit 1. In this way, the battery in PPS unit 1 is discharged more quickly and it will take less time to achieve battery balancing.

Step 2.2: If the relationship between BC1_0 and BC2_0 is as follows:

$$BC1\_0 < BC2\_0 \qquad (8)$$

The above relationship means that the remaining battery capacity of PPS unit 1 is less than the remaining battery capacity of PPS unit 2, then at 404b the BBC sends the current control coefficient, KC2_high to the inverter controller of PPS unit 2 so that the output current of PPS unit 2 is: I2=Iref2=KC2_high*I1. The output current of PPS unit 2 will be higher than the output current of PPS unit 1 and therefore the battery in PPS unit 2 discharges more quickly than the battery in PPS unit 1. The value of KC2_high is larger than 1. As an example, KC2_high=2 may be used. In this case, I2=2*I1. Two-thirds of the load current is delivered by PPS unit 2 and one-third of the load current is delivered by PPS unit 1.

In another embodiment the value of KC2_high can be decided based on the difference between the BC1_0 and BC2_0:

$$Delta\_BCH\_0 = BC2\_0 - BC1\_0 \qquad (9)$$

If Delta_BCH_0 is large, such as larger than around 20%, a larger KC2_high value, such as KC2_high=4, can be used so that more power is produced by PPS unit 2 and less power is produced by PPS unit 1. In this way, the battery in PPS unit 2 is discharged more quickly and it will take less time to achieve battery balancing.

Step 2.3: If the relationship between BC1_0 and BC2_0 is as following:

$$BC1\_0 = BC2\_0 \qquad (10)$$

The above relationship means that the remaining battery capacity of PPS unit 1 is the same as the remaining battery capacity of PPS unit 2, then at 404c the BBC sends the current control coefficient, KC2=1 to the inverter controller of PPS unit 2, and the output current of PPS unit 2 is: I2=Iref2=I1. The output current of PPS unit 2 will be the same as the output current of PPS unit 1 and therefore, the battery in PPS unit 2 discharges at the same rate as the battery in PPS unit 1. Therefore, the remaining battery capacity in PPS unit 1 and PPS unit 2 will remain the same. In this case, I2=I1. Half of the load current is delivered by PPS unit 2 and half of load current is delivered by PPS unit 1.

It is noted that in practice, considering the tolerance of battery capacity estimation by the BMS in a PPS unit, which may for example be implemented in the inverter controller of PPS unit, the remaining battery capacity of two PPS units may be considered as the same when the difference between BC1_0 and BC2_0 is smaller than a smaller percentage, such as 0.5 to 5%, as shown below:

$$Delta\_BC\_0 = abs(BC1\_0 - BC2\_0) \qquad (11)$$

In the above equation, "abs" mean the absolute value calculation. Delta_BC_0 indicates the initial difference between the remaining battery capacity of two PPS units when the battery balancing operation starts. It is a small number, such as, for example, 0.5% to 5%.

Step 3: The above steps are repeated. At 412, at the beginning of the nth battery update interval, T_update_n, the remaining battery capacities of PPS unit 1, BC1_n, PPS unit 2, BC2_n, are transmitted to the BBC.

Step 4: The values of BC1_n and BC2_n are compared in the BBC.

Step 4.1: If BC1_n>BC2_n, then KC2_low is sent to PPS unit 2 and I2=Iref2=KC2_low*I1.

Step 4.2: If BC1_n<BC2_n, then KC2_high is sent to PPS unit 2 and I2=Iref2=KC2_high*I1.

Step 4.3: If BC1_n=BC2_n, then KC2=1 is sent to PPS unit 2 and I2=Iref2=1*I1=I1.

Step 5: Repeat Step 3 and Step 4 at each T_update interval.

Step 6: The above process will be completed when the user terminates the battery balancing operation at 408, 410, or when the batteries in both PPS units have been depleted.

In one embodiment, a hysteresis may be added in equations (6), (8) and in Step 4.1 and Step 4.2 so that the system will not switch over between KC2_low and KC2_high frequently.

Since PPS unit 1 serves as the AC voltage source, one embodiment of the strategy may maintain its battery capacity the highest so it will be the last unit to lose power.

2. Battery Extension Control (BXC), Two PPS Units in Parallel

The Battery Extension Control (BXC) strategy is used to deplete the battery capacity in one PPS unit first and maintain the battery capacity in the other PPS unit as long as possible.

Figure 5A:
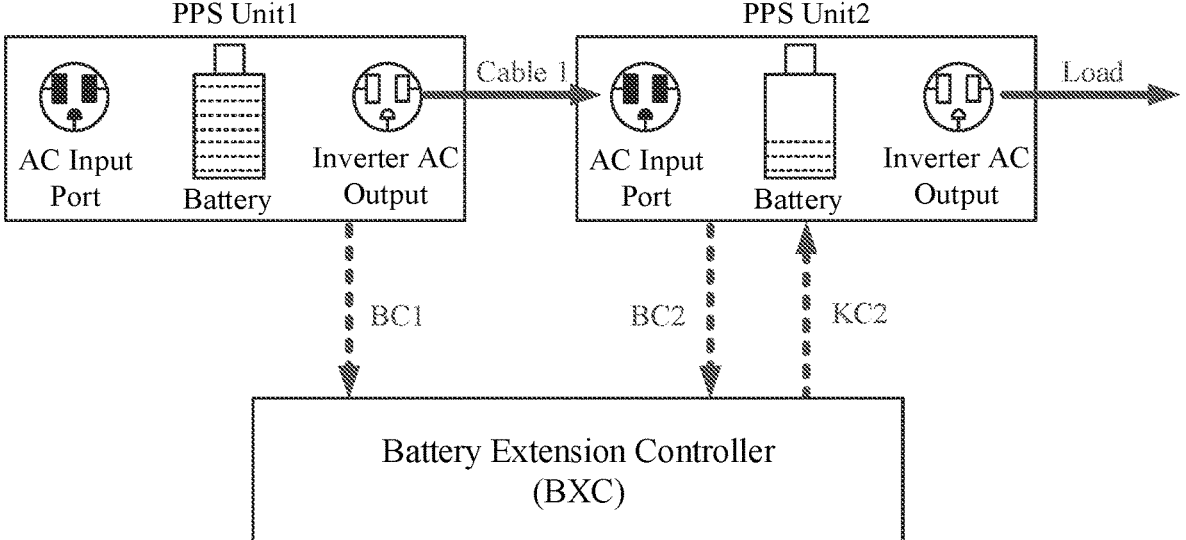
FIG. 5A is a block diagram showing a battery extension controller for two PPS units connected in parallel, according to one embodiment.
Figure 5B:
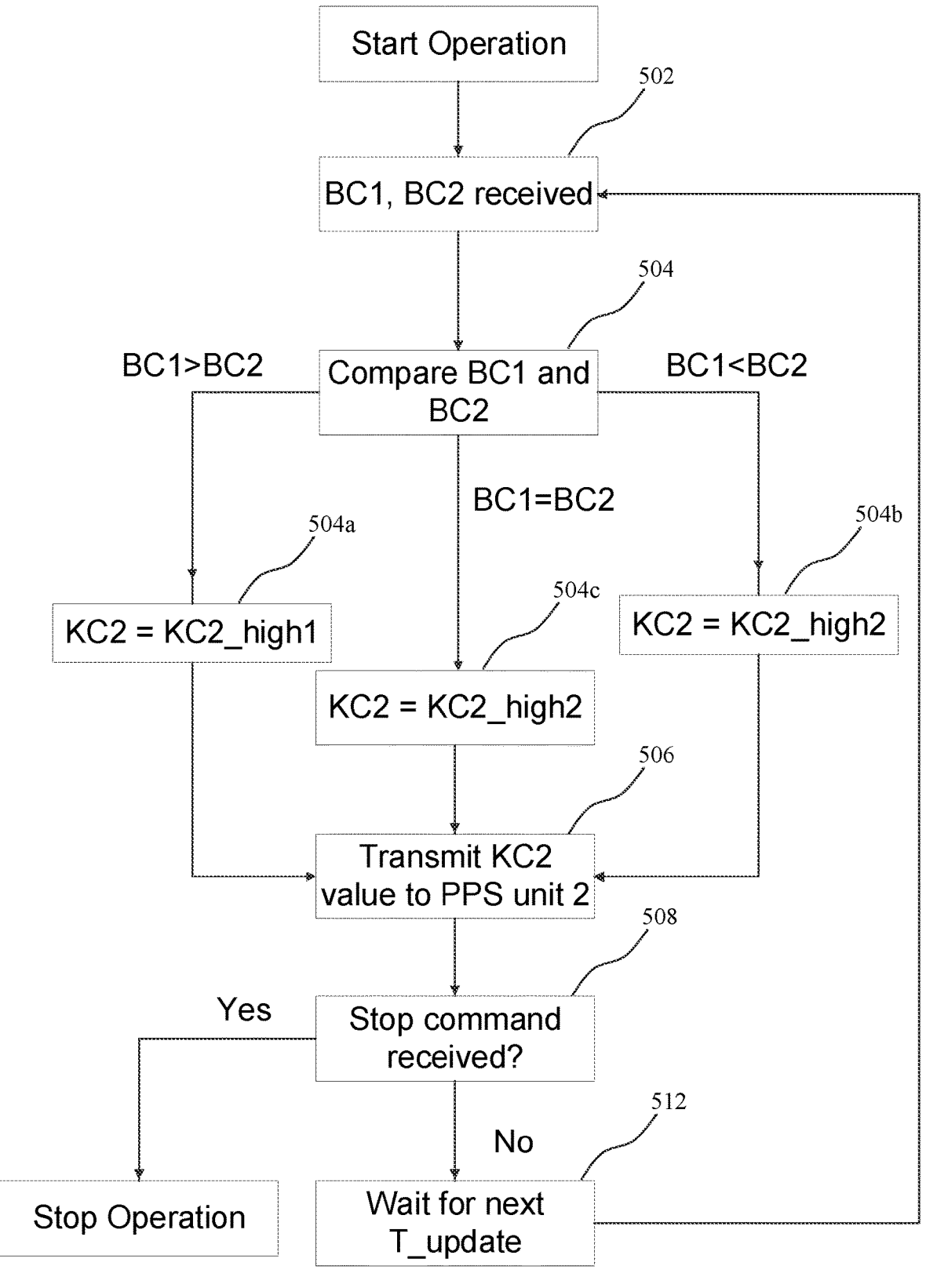
FIG. 5B is a flow chart for a battery extension controller, according to one embodiment.

FIG. 5A shows two PPS units connected in parallel and operating at BXC control, and FIG. 5B is a flowchart of a BXC strategy for two PPS units connected in parallel according to one embodiment. The control strategy may be extended to three or more PPS units connected in parallel. Under BXC control, the battery in one PPS unit will be depleted earlier than the other(s). Assume that the objective is that the battery in PPS unit 2 will be depleted earlier. Then, it is required that PPS unit 2 will provide as much power as possible and only when the load power (P_load) is higher than the maximum power of PPS unit 2 (P_max), PPS unit 1 will provide the additional power, as shown in the following cases.

Case 1.1: If $P\_load < P\_max$, $I2 = IR$ $\qquad (11.1)$

Case 1.2: If $P\_max < P\_load < 2*P\_max$, $I2 = I2\_max$, $I1 = IR - I2$ $\qquad (11.2)$ In the above equations, IR is the load current, $IR=P\_load/VAC$. $I2\_max$ is the maximum output current rating of PPS unit 2. Since there are two PPS units, the maximum load power should be less than $2*P\_max$.

It is noted that under some conditions the load power may be changing unpredictably, and the Battery Extension Controller may not provide the exact current for PPS unit 2. That is, it provides the current relationship between PPS unit 1 and PPS unit 2. Since the objective is to control PPS unit 2 to provide more power, the BXC controller sends KC2_high to PPS 2.

$$I2=Iref2=KC2\_high*I1 \qquad (12.1)$$

$$Iref2\_max=I2\_max \qquad (12.2)$$

It is noted that KC2_high is a numerical value higher than 1. In order to make PPS unit 2 produce as much power as possible, KC2_high may be in a value of, for example, 5 to 10. That is, the BXC controller will make PPS unit 2 produce 5 to 10 times the current value as compared with PPS unit 1. The maximum output current of PPS 2 is I2 max. Therefore, the BXC controller will make PPS unit 2 produce a current significantly higher than the output current of PPS unit 1, such as 5 to 10 times the current of PPS unit 1.

In practical operation, when the remaining battery capacity of PPS unit 2 is lower than the remaining battery capacity of PPS unit 1, then a KC2_high value of larger than 1 transmitted to the inverter controller of PPS unit 2 will result in the battery in PPS unit 2 to be depleted sooner than the battery in PPS unit 1. Therefore, in practical implementation, with reference to FIG. 5B, an embodiment based on the following control strategy may also be implemented:

Step 1: At 502 the remaining battery capacity of PPS unit 1, BC1_n, and PPS unit 2, BC2_n, are transmitted to the BXC controller.

Step 2: Based on a comparison of BC1_n and BC2_n at 504, $$\text{Case 2.1: } At\ 504a,\ if\ BC1\_n>BC2\_n,\ KC2\ high1=2 \qquad (13.1)$$

$$\text{Case 2.2: } At\ 504b,\ if\ BC1\_n<BC2\_n,\ KC2\_high2=5 \qquad (13.2)$$

$$\text{Case 2.3: } At\ 504c,\ if\ BC1\_n=BC2\_n,\ KC2\_high2=5 \qquad (13.3)$$

At 506 the KC2 value is transmitted to the inverter controller of PPS unit 2.

Step 3: If a Stop command is not received at 508, then at 512 repeat Step 1 and Step 2 above until the battery extension control (BXC) is completed.

In case 2.1, if the remaining battery capacity of PPS unit 1 is higher than the remaining battery capacity of PPS unit 2, a smaller value of KC2_high1, such as, e.g., 2, as shown in equation (13.1), is used. In this case, the remaining battery capacity in PPS unit 2 is lower than the remaining battery capacity of PPS unit 1 and PPS unit 2 provides higher current than PPS unit 1. Then the battery in PPS unit 2 will be depleted sooner than the battery of PPS unit 1. In this case, other values, such as, e.g., 1.5, 2.5, 3, or 5, may also be used as KC2_high1.

In case 2.2, if the remaining battery capacity of PPS unit 1 is lower than the remaining battery capacity of PPS unit 2, PPS unit 2 should discharge at a much higher rate than PPS unit 1 and therefore, a larger KC2_high2 value, such as, e.g., 5, as shown in equation (13.2), may be used. Other values, such as, e.g., 4, 4.5, 5.5, 6, 7, 10, may also be used.

In some cases, it is beneficial not to discharge the battery completely to zero to extend the battery life. In these cases, the Battery Extension Control mode will stop when the remaining battery capacity of PPS unit 2 is reduced to a threshold value, such as, e.g., 5%. That is, when BC2_n=5%, the BXC controller will send KC2_low=0.1 to PPS unit 2 and PPS unit 1 will provide most of the power. When BC1_n reaches the threshold value of 5%, the battery extension operation mode is stopped.

3. Battery Balancing and Extension Control (BBXC), Two PPS Units in Parallel

In some cases, it may be desired to control the remaining battery capacities of two PPS units with a certain relationship, such as $$BC1=K*BC2,\ or\ BC1=1.2*BC2 \qquad (14.1)$$

$$or\ BC1=BC2+offset,\ or\ BC1=BC2+10\% \qquad (14.2)$$

In equation (14.1), K is a constant, such as, e.g., K=1.2. Equation (14.1) means that the final target of the battery balancing control is to keep the remaining battery capacity of PPS unit 1 at e.g., 1.2 times the remaining battery capacity of PPS unit 2. Under these two equations, both battery balancing and battery extension may be achieved.

For example, if the initial remaining battery capacity of PPS unit 1 and PPS unit 2 is as follows:

$$BC1\_0=80\%\ and\ BC2\_0=90\% \qquad (15)$$

Then the control strategy based on (14.1) will achieve:

$$BC1\_n=50\%\ and\ BC2\_n=41.7\%,\ or\ BC1\_n=1.2*41.7\%=50\% \qquad (16)$$

Similarly, in equation (14.2), offset is a percentage value, such as offset=10%. Equation (14.2) means that the final target of the battery balancing control is to keep the remaining battery capacity of PPS unit 1 to be 10% higher than the remaining battery capacity of PPS unit 2. If the initial condition is shown in equation (15), the control strategy based on equation (14.2) will achieve:

$$BC\_1\_n=45\%\ and\ BC2\_n=35\%,\ or\ BC1\_n=BC2\_n+10\% \qquad (17)$$

It is noted that in the above description, values such as 50%, 41.7%, 45%, and 35% are used for illustration only. A value may be selected depending on the actual load condition and the initial battery capacity.

Some conditions may determine whether the final battery capacity relationship between PPS unit 1 and PPS unit 2 can be achieved.

For example, if PPS unit 1 and PPS unit 2 are each rated at 600 W and the load power is 1,200 W which is equal to two times the maximum output power of each PPS unit, then each PPS unit will provide maximum power and no battery balancing can be achieved.

In another example, if BC1_0=5% and BC2_0=95%, then the condition BC1_n=1.2*BC2_n may not be achieved.

The following description is based on equation (14.2). The result will be same under equation (14.1).

Figure 6A:
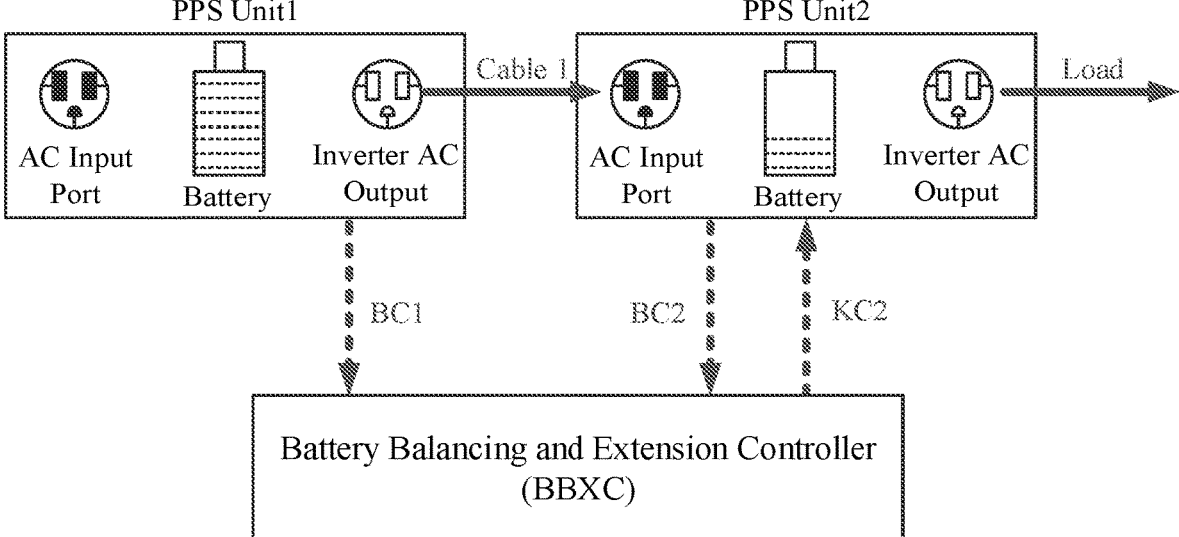
FIG. 6A is a block diagram showing a battery balancing and extension controller for two PPS units connected in parallel, according to one embodiment.
Figure 6B:
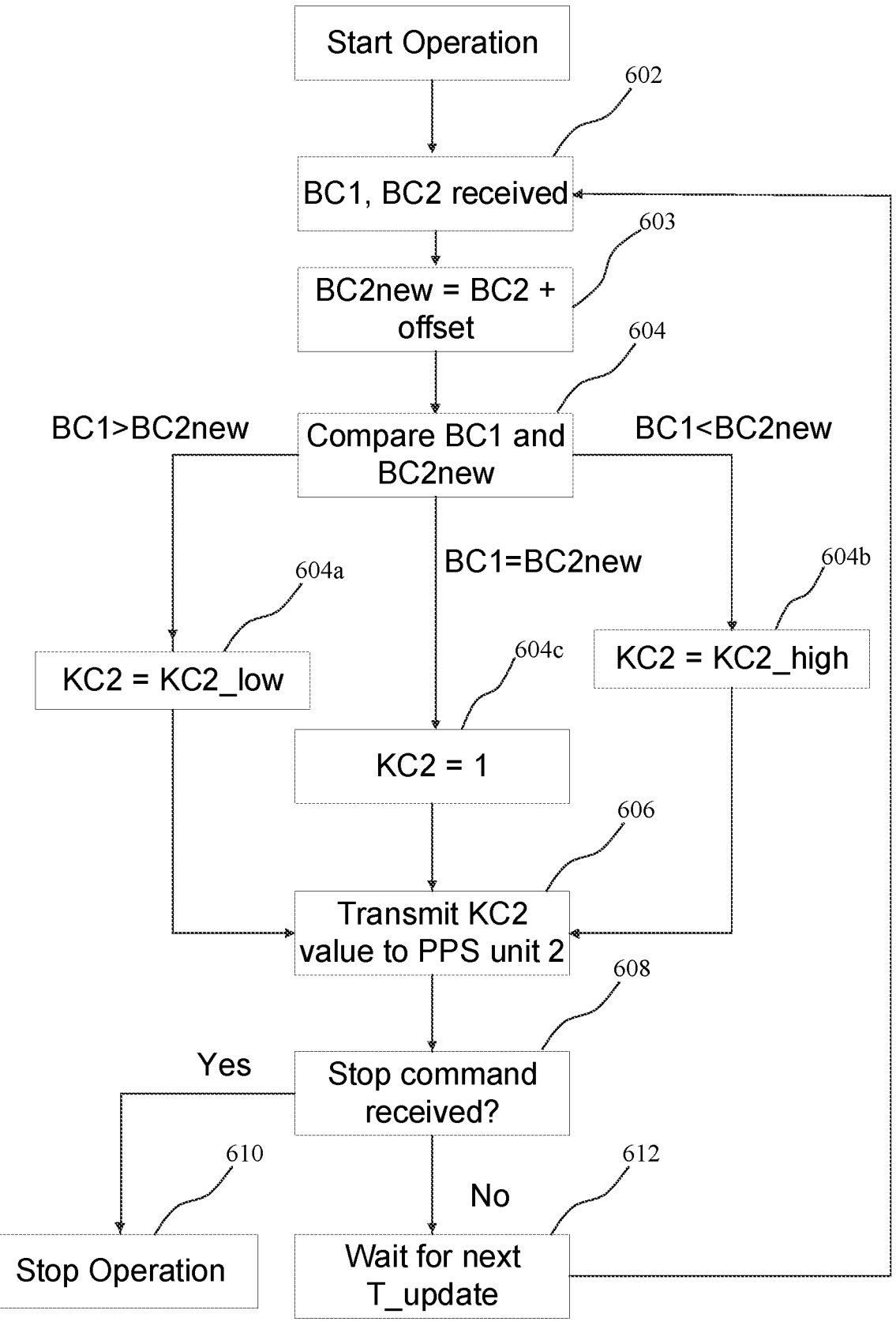
FIG. 6B is a flow chart for a battery balancing and extension controller, according to one embodiment.

PPS unit 1 will produce an AC voltage source and PPS unit 2 will produce an AC current source. FIG. 6A shows two PPS units connected in parallel and operating under BBXC control, and FIG. 6B is a flowchart of a BBXC strategy for two PPS units connected in parallel according to one embodiment. The BBXC strategy may be described as follows, with reference to FIG. 6B:

Step 1: At the beginning of the Battery Balancing and Extension Control operation, T_update_0, at 602 the remaining battery capacity of PPS unit 1, BC1_0, and the remaining battery capacity of PPS unit 2, BC2_0, are transmitted to BBXC. At 603 the desired "offset" value is defined by the user before the activation of BBXC control mode. In FIG. 6B, BC2new=BC2_0+offset.

Step 2: At 604 the BBXC compares the values of BC1_0 and BC2new=BC2_0+offset.

Step 2.1: At 604a, if the relationship is as follows:

$$BC1\_0 > BC2\_0 + offset \qquad (18.1)$$

Then at 606 the BBXC sends the current control coefficient, KC2_low, to the inverter controller of PPS unit 2, where KC2_low is a value between 0 and 1. The output current of PPS unit 2 will be:

$$I2\_1 = Iref2\_1 = KC2\_low * I1\_1 \qquad (18.2)$$

That is, during the next T_update period, T_update_1 in this case, PPS unit 2 will produce a current that is lower than the output current of PPS unit 1. Therefore, PPS unit 1 will discharge faster than PPS unit 2 and the reduction rate of PPS unit 1 battery will be faster than the reduction rate of PPS unit 2 battery.

Step 2.2: At 604b, if the relationship is as follows:

$$BC1\_0 < BC2\_0 + offset \qquad (19.1)$$

Then at 606 the BBXC transmits the current control coefficient, KC2_high, to the inverter controller of PPS unit 2, where KC2_high is a value larger than 1. The output current of PPS unit 2 will be:

$$I2\_1 = Iref2\_1 = KC2\_high * I1\_1 \qquad (19.2)$$

That is, during the next T_update period, T_update_1 in this case, PPS unit 2 will produce a current that is higher than the output current of PPS unit 1. Therefore, PPS unit 2 will discharge faster than PPS unit 1 and the reduction rate of PPS unit 2 battery will be faster than the reduction rate of PPS unit 1 battery.

Step 2.3: At 604c, if the relationship between BC1_0 and BC2_0 is as following:

$$BC1\_0 = BC2\_0 + offset, \text{ or } abs(BC1\_0 - BC2\_0 - offset) \\ < Delta\_BC \qquad (20.1)$$

In the above equation, Delta_BC is a predetermined small value, such as, e.g., 0.25% to 5%. The above equation means that the remaining battery capacity of PPS unit 1 and PPS unit 2 meets the target relationship as shown in equation (14.2). It is considered that the target has been reached. Then at 606 the BBXC transmits KC2=1 to PPS unit 2, as follows:

$$I2\_1 = Iref2\_1 = 1 * I1\_1 \qquad (20.2)$$

In this case, PPS unit 2 and PPS unit 1 will produce the same output current and the battery discharge rate of the two PPS units will be same. Therefore, it is expected that the remaining battery capacity will maintain same ratio as described in equation (14.2).

Step 3: If a Stop command is not received at 608, then at 612 the above steps repeat. At the beginning of an nth battery update interval, T_update_n, the remaining battery capacity of PPS unit 1, BC1_n, is transmitted to BBXC. The remaining battery capacity of PPS unit 2, BC2_n, is transmitted to BBXC.

Step 4: The values of BC1_n and BC2new=BC2_n+offset are compared at BBXC

Step 4.1: If BC1_n>BC2_n+offset, then KC2_low is sent to PPS2 and I2=Iref2=KC2_low*I1

Step 4.2: If BC1_n<BC2_n+offset, then KC2_high is sent to PPS2 and I2=Iref2=KC2_high*I1

Step 4.3: If BC1_n=BC2_n+offset, then KC2=1 is sent to PPS2 and I2=Iref2=1*=I1=I1

Step 5: Repeat Step 3 and step 4 for each T_update time interval.

Step 6: The above process will be completed when the user terminates the battery balancing and extension operation by issuing a Stop command at 610, or when the battery in both PPS units has been depleted.

In one embodiment, a hysteresis may be added to avoid frequent switch over between KC2_high and KC2_low.

It is noted that the remaining battery capacity of both PPS unit 1 and PPS unit 2 is sent to the BBXC controller at every T-update interval. Therefore, if the battery capacity sensor is not accurate enough, or the efficiency of the PPS units are different, the battery capacity may be adjusted in every T_update time interval. The control strategy may be extended to three or more PPS units connected in parallel.

Summary of Battery Capacity Controller (BCC)

Features of a BCC as described above for implementing Battery Balancing Control (BBC), Battery Extension Control (BXC), and Battery Balancing and Extension Control (BBXC) may be summarized as follows:

1: The remaining battery capacity of each PPS unit is sent to the BCC and is used to control the relative value of the remaining battery capacities in PPS units in the parallel connected system.

2: Based on the remaining battery capacity and the control strategy employed, the BCC sends the current control coefficient, KC2, to PPS unit 2. KC2 is used to set the relationship between the output current of PPS unit 2 and output current of PPS unit 1. KC2_high (>1) means that PPS unit 2 will produce higher current than PPS unit 1 and therefore the battery in PPS unit 2 will be discharged more quickly. KC2_low (between 0 and 1) means that PPS unit 2 will produce a lower current than PPS unit 1 and therefore the battery in PPS unit 2 will be discharged less quickly.

3: The remaining battery capacity of each PPS unit is sent to the controller every update period, such as T_update, which is pre-determined, such as, e.g., between 10 second and 1 minute.

4: There is no direct communication between each PPS unit. Instead, each PPS unit communicates with the controller, e.g., wirelessly, such as by Bluetooth or Wi-Fi. The controller sends only the current control coefficient, KC2, to PPS unit 2.

Battery Capacity Controller, More than Two PPS Units Connected in Parallel

Figure 7:
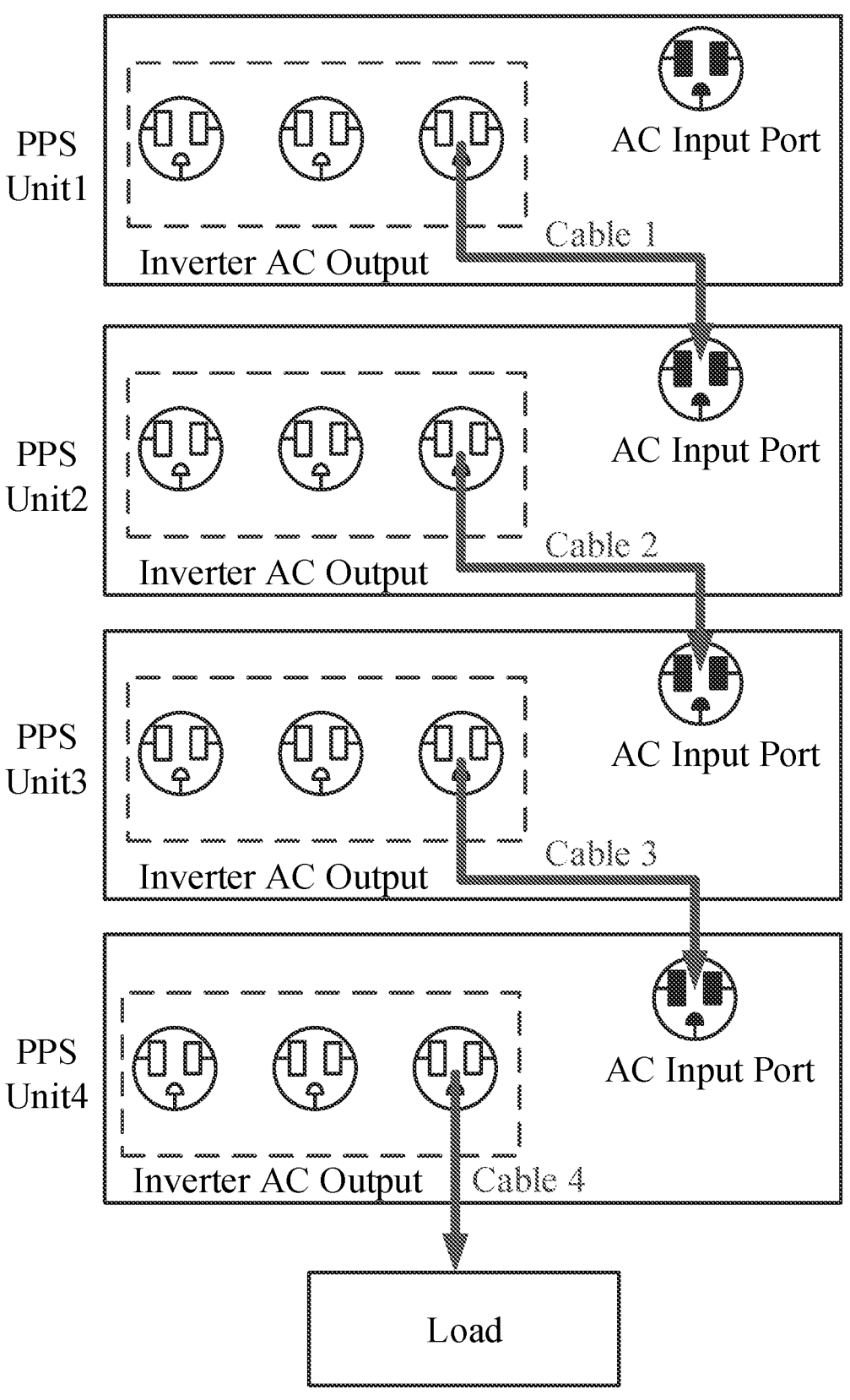
FIG. 7 is a diagram showing face plate connections of four portable power stations connected in parallel, according to one embodiment.
Figure 8:
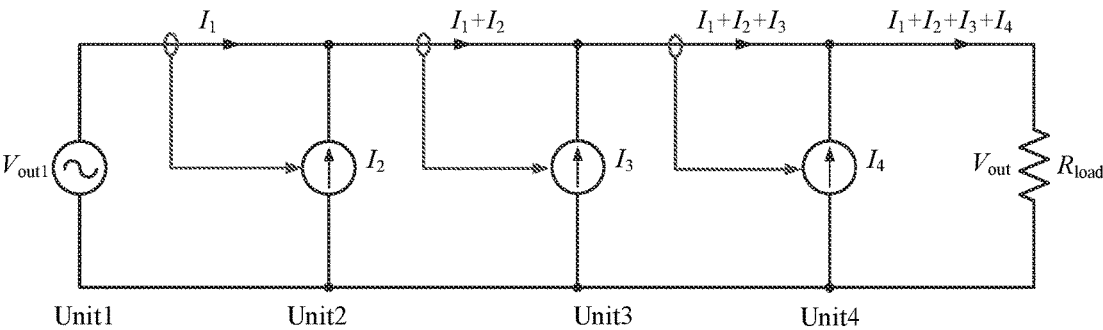
FIG. 8 is a schematic diagram of an equivalent circuit of the parallel operation of the four PPS units of FIG. 7, according to one embodiment.

As noted above, a BCC as described herein (BBC, BXC, BBXC) may be extended to more than two PPS units. This section provides a brief illustration of applying the above features to multiple PPS units connected in parallel. For example, FIG. 7 shows four PPS units connected in parallel to produce more power. FIG. 8 shows the equivalent circuit of the connection. It is noted that PPS unit 1 produces an AC voltage source and PPS unit 2, PPS unit 3, and PPS unit 4 produce an AC current source.

Example: Battery Balancing Control, Four PPS Units Connected in Parallel

Figure 9:
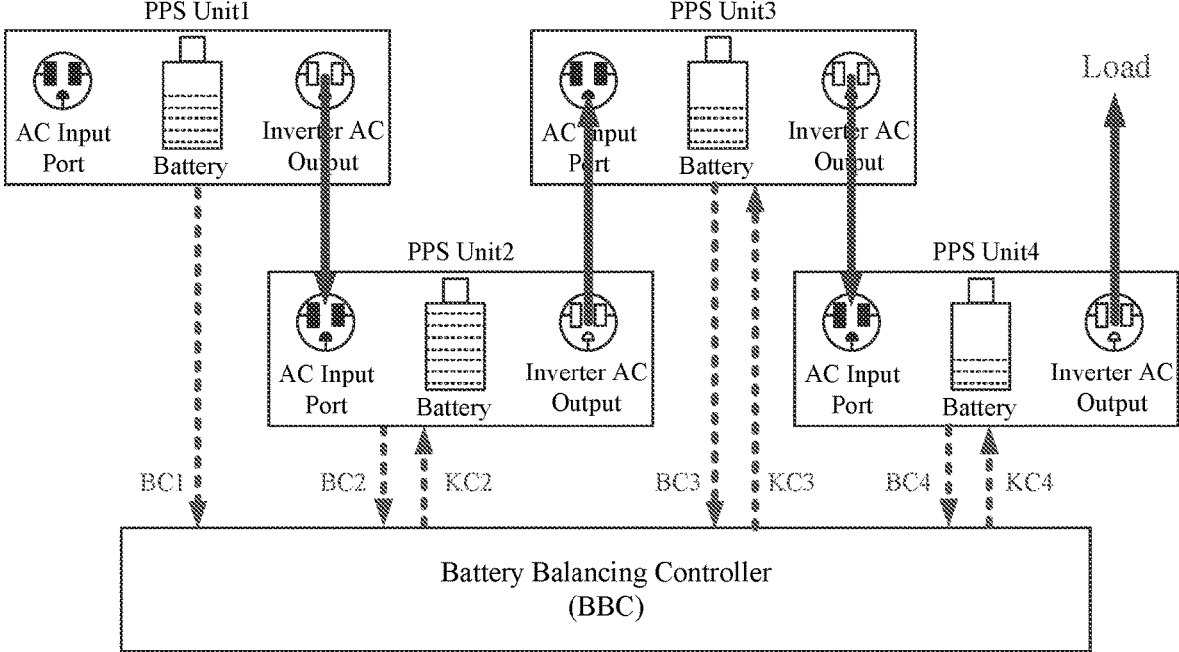
FIG. 9 is a block diagram showing a battery balancing controller for four PPS units connected in parallel, according to one embodiment.

FIG. 9 shows four PPS units connected in parallel, wherein the BBC is implemented. The value of the AC current is controlled by the current control coefficient, KC2, KC3, and KC4. The remaining battery capacities of the four PPS units are transmitted to the BBC, e.g., via Bluetooth or Wi-Fi. Assume that the initial remaining battery capacities of the four units are different. The objective of the BBC is to make the remaining battery capacity of these four PPS units the same after some time of operation. Based on the current battery capacity, BC1_n, BC2_n, BC3 n, and BC4 n, the BBC controller will transmit the current control coefficient, KC2, KC3, and KC4 to PPS unit 2, PPS unit 3, and PPS unit 4, respectively, to control the output current of PPS unit 2, PPS unit 3, and PPS unit 4 so that their output powers will be different.

According to BBC control, (1) for the PPS unit with higher remaining battery capacity, this PPS unit should produce more power than the others so that its battery will discharge at a faster rate than the other PPS units; (2) for the PPS unit with lower remaining battery capacity, this PPS unit should produce less power than the others so that its battery will discharge at a slower rate than the other PPS units. The current control coefficient, KC2, KC3, and KC4, will be updated in every T_update time interval.

One control strategy to achieve Battery Balancing Control is to use the average battery capacity of the four PPS units. For the PPS units with remaining battery capacity higher than the average remaining battery capacity, those PPS units will discharge at higher rate than those PPS units with lower-than-average remaining battery capacity.

The following equation calculates the average remaining battery capacity of four PPS units for nth update interval, T_update_n:

$$BC\_avg\_n=(BC1\_n+BC2\_n+BC3\_n+BC4\_n)/4 \qquad (21)$$

It is also noted that with four PPS units in parallel, the output current of each unit is determined by:

$$\text{For unit 2: } I2=Iref2=KC2*Iin2=KC2*I1 \qquad (22.1)$$

$$\text{For unit 3: } I3=Iref3=KC3*Iin3/2=KC3*(I1+I2)/2 \qquad (22.2)$$

$$\text{For unit 4: } I4=Iref4=KC4*Iin4/3=KC4*(I1+I2+I3)/3 \qquad (22.3)$$

In the above equations, Iinj (j=2, 3, 4) is the current flowing into the AC input port of unit j. Irefj refers to the reference current for unit j.

In more general terms, equations (22.1), (22.2), and (22.3) can be combined as:

$$\text{For unit } j, Irefj=Iinj/(j-1) \qquad (23)$$

For example, in the above equation, j=2, 3, and 4.

The following steps illustrate an embodiment of the above Battery Balancing Control strategy.

Step 1: At nth update interval, T_update_n, the remaining battery capacity of each PPS unit (BCj_n) is transmitted to the BBC controller, j=1, 2, 3, and 4.

Step 2: The average remaining battery capacity, BC_avg_n is calculated as:

$$BC\_avg\_n=(BC1\_n+BC2\_n+BC3\_n+BC4\_n)/4 \qquad (24)$$

Step 3.1: For j=2, 3, 4, if $$BCj\_n<BC\_avg\_n, \text{ then } KCj\_n=KCj\_low \text{ is sent to } PPS j \qquad (25.1)$$

Step 3.2: For j=2, 3, 4, if $$BCj\_n>BC\_avg\_n, \text{ then } KCj\_n=KCj\_high \text{ is sent to } PPS j \qquad (25.2)$$

Step 3.3: For j=2, 3, 4, if $$BCj\_n=BC\_avg\_n, \text{ then } KCj\_n=1 \text{ is sent to } PPS j \qquad (25.3)$$

Step 4: Repeat Step 1 to Step 3.

Step 5: The above process will be completed when the user terminates the battery balancing operation, or when the batteries in the PPS units have been depleted. In practical application, the operation may be stopped when the remaining battery is less than BC_zero. BC_zero is a very small number, such as, e.g., 0.25% to 5%. For example, when the battery is fully charged, the remaining battery capacity is 100%. If, e.g., BC_zero is set to 2%, then when the remaining battery capacity is reduced to 2%, it is considered that the battery is fully depleted and should not be used.

Note 1: Equation (25.3) also means that the difference between BCj_n and BC_avg_n is within Delta_BC, a very small value, such as, e.g., 0.25% to 5%.

Note 2: KCj_low is a number between 0 and 1. KCj_high is a number higher than 1.

A numerical example is provided as follows:

Initial condition: BC1_0=60%, BC2_0=70%, BC3_0=50%, BC4_0=40%. It is assumed that KCj_low=0.5 and KCj_high=2.

Then: BC_avg_0=(60%+70%+50%+40%)/4=55%.

Then, $$BC2\_0>BC\_avg\_0, \text{ and } KC2=KC2\_high=2,$$
$$I2=Iref2=2*I1 \qquad (26.1)$$

$$BC3\_0<BC\_avg\_0, \text{ and } KC3=KC3\_low=0.5,$$

$$I3=Iref3=0.5*Iin3/(3-1)=0.5*(I1+I2)/2=0.5*3*I1/2=0.75*I1 \qquad (26.2)$$

$$BC4\_0<BC\_avg\_0, \text{ and } KC4=KC4\_low=0.5,$$

$$I4=Iref4=0.5*Iin4/(4-1)=0.5*(I1+I2+I3)/3=0.625*I1 \qquad (26.3)$$

In the above example, PPS unit 1 will produce output current I1. PPS unit 2 will produce output current 2*I1. PPS unit 3 will produce output current 0.75*I1, and PPS unit 4 will produce output current of 0.625*I1.

Since the remaining battery capacity in PPS unit 1 and PPS unit 2 is more than the average value, these two PPS units will produce higher current. The remaining battery capacity in PPS unit 3 and PPS unit 4 is less than the average value and these two PPS units will produce lower current. The battery discharge rate for PPS unit 1 and PPS unit 2 will be faster than the battery discharge rate of PPS unit 3 and PPS unit 4.

Therefore, after one update time interval, the difference of the remaining battery capacity among the four units will be smaller. After a certain update interval, T_update, the remaining battery capacity for the four PPS units will be same. Therefore, battery balancing may be achieved.

It is noted that KC2_high=2 and KC3_low=KC4_low=0.5 are selected. Other values may also be selected. In addition, different values for KC3_low and KC4_low may be used.

The difference between the actual battery capacity and the average battery capacity may also be used to determine the current control coefficient, KC value. For example, the following control strategy can be used:

Rule 1: KCj_high1 is selected to be 3 (KCj_high1) for the PPS unit with the highest remaining battery capacity.

Rule 2: KCj_high2 is selected to be 1.5 (KCj_high2) for the PPS unit with remaining battery capacity higher than the average remaining battery capacity.

Rule 3: KCj_low1 is selected to be 0.25 (KCj_low1) for the PPS unit with the lowest battery capacity.

Rule 4: KCj_low2 is selected to be 0.5 (KCj_low2) for the PPS unit with remaining battery capacity lower than the average remaining battery capacity.

In the above rules, KCj_high1>KCj_high2 and KCj_low1<KCj_low2.

Using the above four rules, the output current of four PPS units, as in the above example, may be calculated as follows:

BC2_0=70%, highest value among PPS 2, 3, and 4.

$$KC2=3, I2=Iref2=3*I1 \qquad (27.1)$$

$$BC3\_0=50\%,\ KC3=0.5,\ I3=Iref3=0.5*(I1+I2)/ \\ 2=0.5*4*I1/2=I1 \tag{27.2}$$

BC4_0=40%, lowest value, $$I4=Iref4=0.25*(I1+I2+I3)/3=0.25*5/3=0.41*I1 \tag{27.3}$$

As compared with equations (26.1), (26.2), and (26.3), the output current as shown in equations (27.1), (27.2), and (27.3) will achieve faster battery balancing.

Of course, other rules may also be used to achieve battery balancing with the strategy described by equations (24), (25.1), (25.2), and (25.3), with the goal of producing higher output current for PPS units with higher remaining battery capacity and producing lower output current for PPS units with lower remaining battery capacity.

Figure 10:
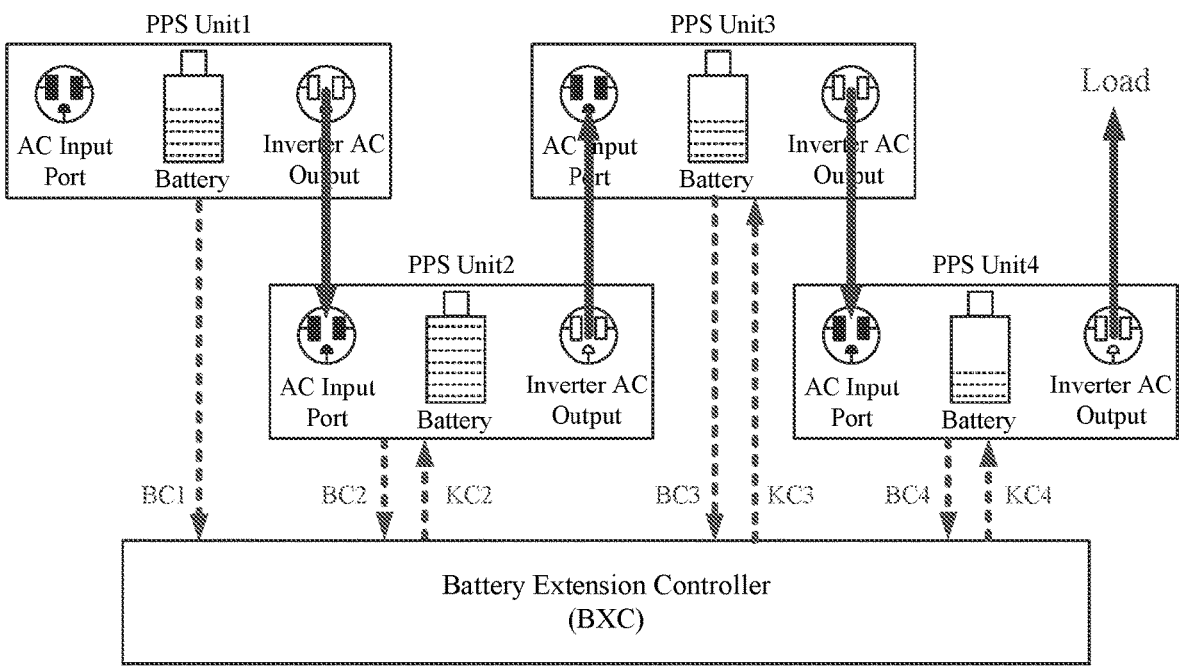
FIG. 10 is a block diagram showing a battery extension controller for four PPS units connected in parallel, according to one embodiment.

Example: Battery Extension Control (BXC), Four PPS Units Connected in Parallel FIG. 10 is a diagram showing the Battery Extension Control (BXC) for four PPS units connected in parallel. According to this example, the four PPS units are identical and it is desired that the battery in PPS unit 4 will be depleted first; the battery in PPS unit 3 depleted the next; the battery in PPS unit 2 be depleted third, and the battery in PPS unit 1 will be depleted last.

Similar to the control strategy for Battery Extension Control of two PPS units in parallel, the following control strategy can be used:

Step 1: The remaining battery capacity of PPS unit 1, PPS unit 2, PPS unit 3, and PPS unit 4 (i.e., BC1_n, BC2_n, BC3_n, and BC4_n, respectively) are transmitted to the BXC controller, such as via Bluetooth or Wi-Fi.

Step 2: Check if BC4_n is below the lowest battery threshold, BC_zero.

If BC4_n<BC_zero, turn inverter 4 off and go to step 4.
If BC4 n>=BC_zero, then:
Case 2.1: If BC4_n is the lowest, $$KC4=KC4\_high1,\ KC2=KC2\_high1, \\ KC3=KC3\_high1\ are\ sent\ to\ PPS2,\ PPS\ 3,\ and \\ PPS\ 4 \tag{28.1}$$

For example:

$$KC4\_high1=2,\ KC2\_high1=1.2,\ KC3\_high1=1.2 \tag{28.2}$$

In this way, the output current of PPS unit 4 will be the highest and the output current of PPS unit 1 will be the lowest.

Case 2.2: If BC4 n is not the lowest, $$KC4=KC4\_high2,\ KC2=KC2\_high2, \\ KC3=KC3\_high2\ are\ sent\ to\ PPS2,\ PPS\ 3,\ and \\ PPS\ 4 \tag{28.3}$$

For example:

$$KC4\_high2=5,\ KC2\_high2=1.2,\ KC3\_high2=1.2 \tag{28.4}$$

In this way, the output current of PPS unit 4 will be much larger than the other PPS units and its battery will be depleted at the highest rate.

Step 3: Repeat Step 1 and Step 2 for every T_update interval.

Step 4: The remaining battery capacity of PPS unit 1, PPS unit 2, and PPS unit 3, BC1_n, BC2_n, and BC3_n, are transmitted to BXC at every T_update time interval.

If BC3_n<BC_zero, turn inverter 3 off, and go to step 6.
If BC3_n>=BC_zero, then:
Case 4.1: If BC3_n is the lowest, $$KC3=KC3\_high3=2,\ KC2=KC2\_high3=1.2\ are\ sent \\ to\ PPS2,\ and\ PPS\ 3 \tag{29.1}$$

In this way, the output current of PPS unit 3 will be the largest and the battery in PPS unit 3 will be depleted in the fastest rate.

Case 4.2: If BC3 n is not the lowest, $$KC3=KC3\_high4=5,\ KC2=KC2\_high4=1.2\ are\ sent \\ to\ PPS2,\ and\ PPS\ 3 \tag{29.2}$$

In this way, the output current of PPS unit 3 will be much larger than the other PPS units and its battery will be depleted at the highest rate.

Step 5: repeat step 4 for every T_update interval
Step 6: The remaining battery capacity of PPS unit 1 and PPS unit 2, BC1_n and BC2_n are transmitted to BXC at every T_update time interval.

If BC2_n<BC_zero, turn inverter 2 off and go to step 8.
If BC2_n>=BC_zero, then:
Case 6.1: If BC2_n is the lowest, $$KC2=KC2\_high5=2\ is\ sent\ to\ PPS2 \tag{30.1}$$

Case 6.2: If BC2_n is not the lowest, $$KC2=KC2\_high6=5\ is\ sent\ to\ PPS2 \tag{30.2}$$

In the above two cases, PPS unit 2 will produce the larger output current, and its battery will deplete at a faster rate.

Step 7: repeat step 6 for every T_update interval.

Step 8: At this stage, PPS unit 2, PPS unit 3, and PPS unit 4 are turned off because the batteries on these three units are depleted. Only PPS unit 1 is operating.

The above operation will be completed when the user stops the Battery Extension Operation or when all the batteries in the four PPS units are depleted.

According to the above control strategy, one PPS unit provides the largest current and its battery will deplete at the highest rate and will be depleted the first. The numerical values KC=2, 5 are examples to illustrate this objective. Other values larger than 1, such as 2, 3, 10, etc., may also be used. The numerical value KC=1.2 is an example and other values, such as 1, 1.1, 1.5 may also be used.

It is noted that with above control strategy, the output current of each PPS unit should be limited to the maximum current of the inverter.

Example: Battery Balancing and Extension Control (BBXC), Four PPS Units Connected in Parallel In some applications, it may be desired that for multiple (e.g., four) PPS units connected in parallel, the remaining battery capacities of the four PPS units follow a certain distribution. For example, it may be desired that (1) the battery capacity of PPS unit 1 is always 5% higher than that of PPS unit 2; (2) the battery capacity of PPS unit 2 is always 5% higher than that of PPS unit 3; and (3) the battery capacity of PPS unit 3 is always 5% higher than that of PPS 4, as shown in following equations:

$$BC1=BC2+offest1=BC2+5\% \tag{31.1}$$

$$BC2=BC3+offset2=BC3+5\% \tag{31.2}$$

$$BC3=BC4+offset3=BC4+5\% \tag{31.3}$$

In the above equations, an offset value of 5% is used as an example. Other values may also be used.

Figure 11:
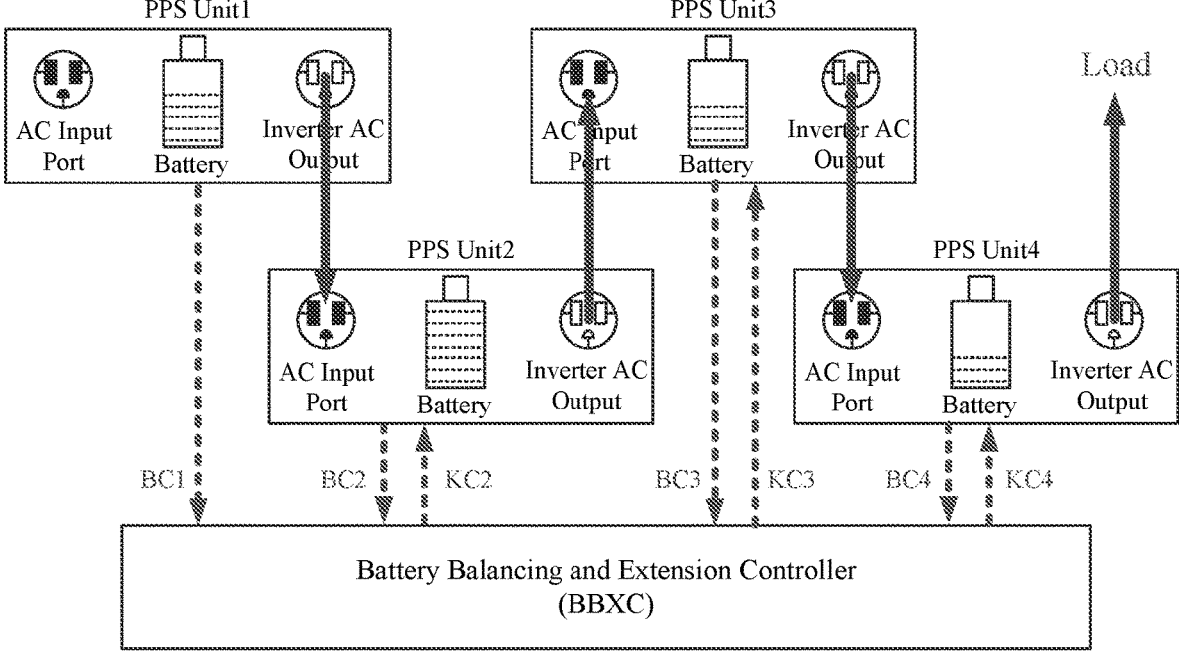
FIG. 11 is a block diagram showing a battery balancing and extension controller for four PPS units connected in parallel, according to one embodiment.

FIG. 11 is a diagram showing the Battery Balancing and Extension Control implemented for four PPS units connected in parallel. In every update interval, T_update, the remaining battery capacity of each PPS unit is transmitted to the BBXC controller. Based on the remaining battery capacity of the four PPS units, the BBXC controller will transmit the current control coefficients, KC2, KC3, and KC4 to PPS unit 2, PPS unit 3, and PPS unit 4, respectively. The following control strategy can be used to achieve the Battery Balancing and Extension Control.

Step 1: At nth update interval, T_update_n, the remaining battery capacity of each PPS unit (BCj_n) is sent to the BBXC controller.

Step 2: A new Battery Capacity value is calculated based on the desired offset as follows:

$$BC1\_n\_new = BC1\_n + offset1 \qquad (32.1)$$

$$BC2\_n\_new = BC2\_n + offset2 \qquad (32.2)$$

$$BC3\_n\_new = BC3\_n + offset3 \qquad (32.3)$$

$$BC4\_n\_new = BC4\_n \qquad (32.4)$$

The average remaining battery capacity, BC_avg_n is calculated as following:

$$BC\_avg\_n = (BC1\_n\_new + BC2\_n\_new + BC3\_n\_new + BC4\_n\_new)/4 \qquad (33)$$

Step 3.1: For j=2, 3, 4, if $$BCj\_n\_new < BC\_avg\_n, \text{ then, } KCj\_n = KCj\_low \text{ is sent to } PPS \text{ unit } j \qquad (34.1)$$

Step 3.2: For j=2, 3, 4, if $$BCj\_n\_new > BC\_avg\_n, \text{ then } KCj\_n = KCj\_high \text{ is sent to } PPS \text{ unit } j \qquad (34.2)$$

Step 3.3: For j=2, 3, 4, if $$BCj\_n\_new = BC\_avg\_n, \text{ then } KCj\_n = 1 \text{ is sent to } PPS \text{ unit } j \qquad (34.3)$$

Step 4: Repeat Step 1 to Step 3.

Step 5: The above process will be completed when the user terminates the battery balancing and extension operation.

Note 1: After a period of operation, the remaining battery capacity of the four PPS units will be distributed according to equations (31.1), (31.2), and (31.3).

Note 2: With the above assumption, the battery in PPS unit 4 will be depleted first. After the battery of PPS unit 4 is depleted, the inverter of PPS unit 4 will be turned off and the load will be powered by PPS unit 1, PPS unit 2 and PPS unit 3. Then the battery of PPS unit 3 is depleted next. Then, the battery of PPS unit 2 will be depleted next, and the battery of PPS unit 1 will be depleted last.

Note 3: When the battery capacity is lower than BC_zero, the battery is considered as depleted. BC_zero is a very small number, in the range of, e.g., 0.5% to 5% of its full capacity. In practical application, the operation may be stopped when the remaining battery capacity reaches less than BC_zero.

Note 4: KCj_low is a number between 0 and 1. KCj_high is a number higher than 1. BCj_n_new=BC_avg_n means that the difference between BCj_n_new and BC_avg_n is within Delta_BC, a very small value, such as, e.g., 0.25% to 5%.

Note 5: Different KCj_low and KCj_high may be used under different conditions. For example, KCj_low and KCj_high may be selected based on the values of the remaining battery capacity, load power, etc.

Example: Battery Capacity Control (BCC) with any Number (n) of PPS Units Connected in Parallel FIG. 12A is a block diagram of a general arrangement for BCC with any number of PPS units connected in parallel.

Figure 12A:
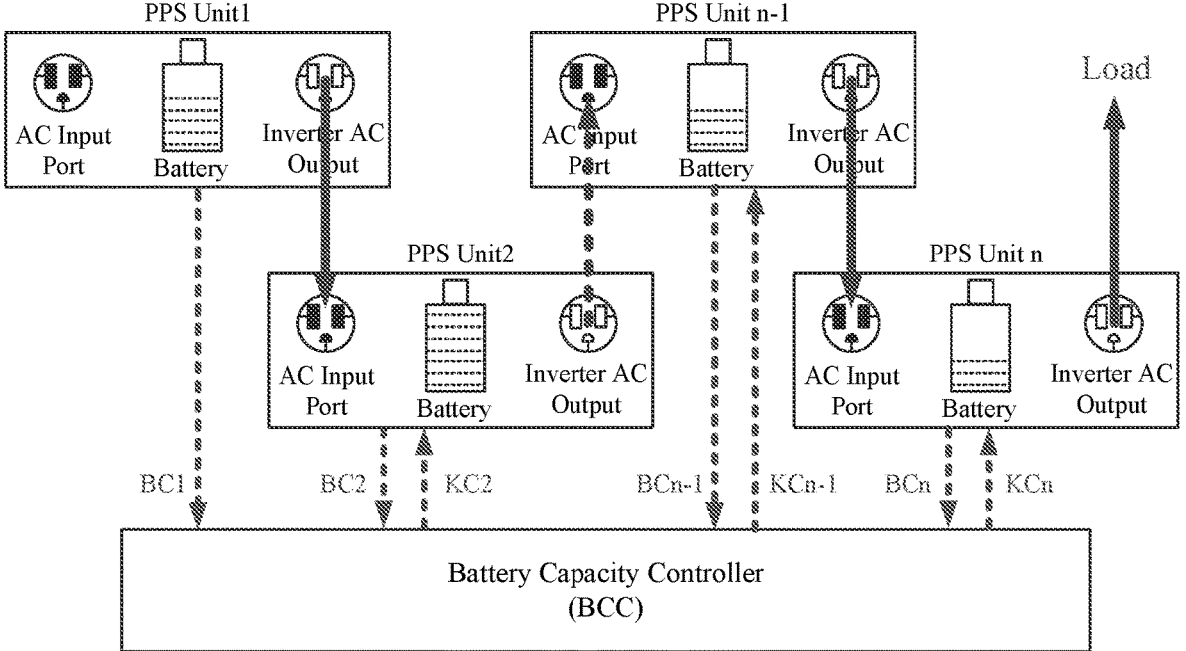
FIG. 12A is a block diagram showing a battery capacity controller for n PPS units connected in parallel, according to one embodiment.

According to FIG. 12A, a total of n PPS units are connected in parallel. PPS unit 1 produces an AC voltage source, and all the other PPS units produce an AC current source. The load is connected to the inverter AC output of unit n.

Figure 12B:
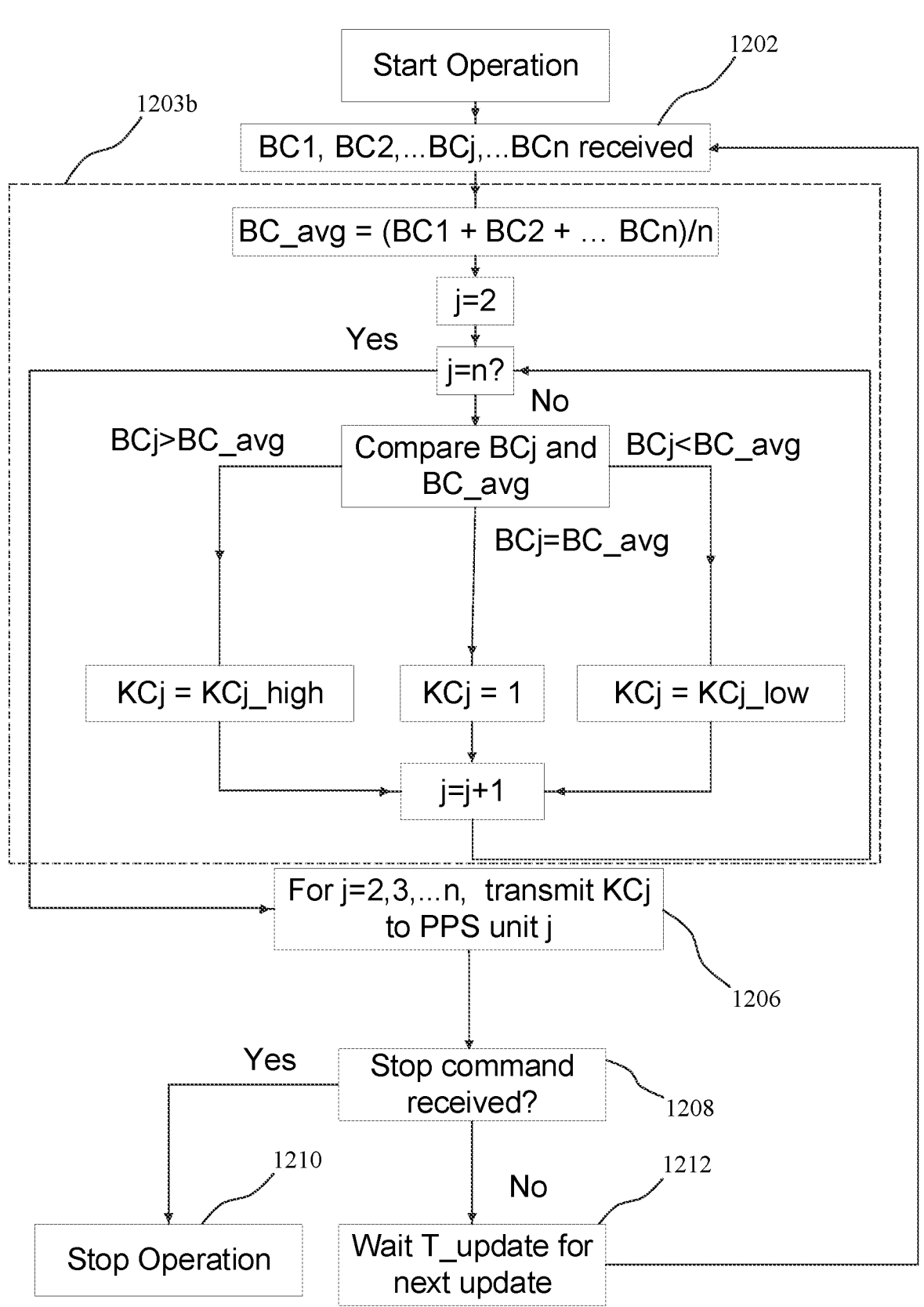
FIG. 12B is a flow chart for a battery balancing controller with n PPS units, according to one embodiment.
Figure 12C:
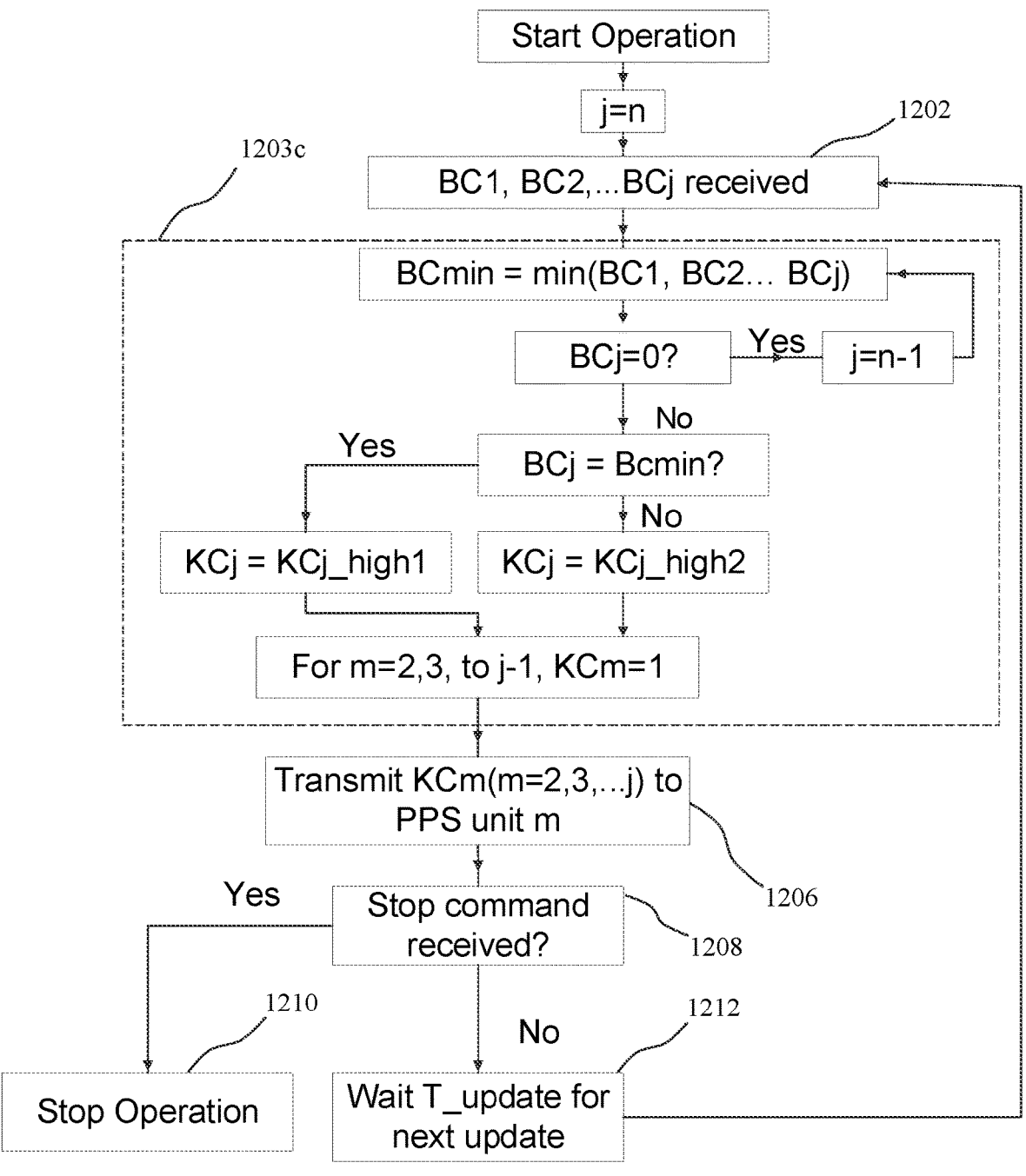
FIG. 12C is a flow chart for a battery extension controller with n PPS units, according to one embodiment.
Figure 12D:
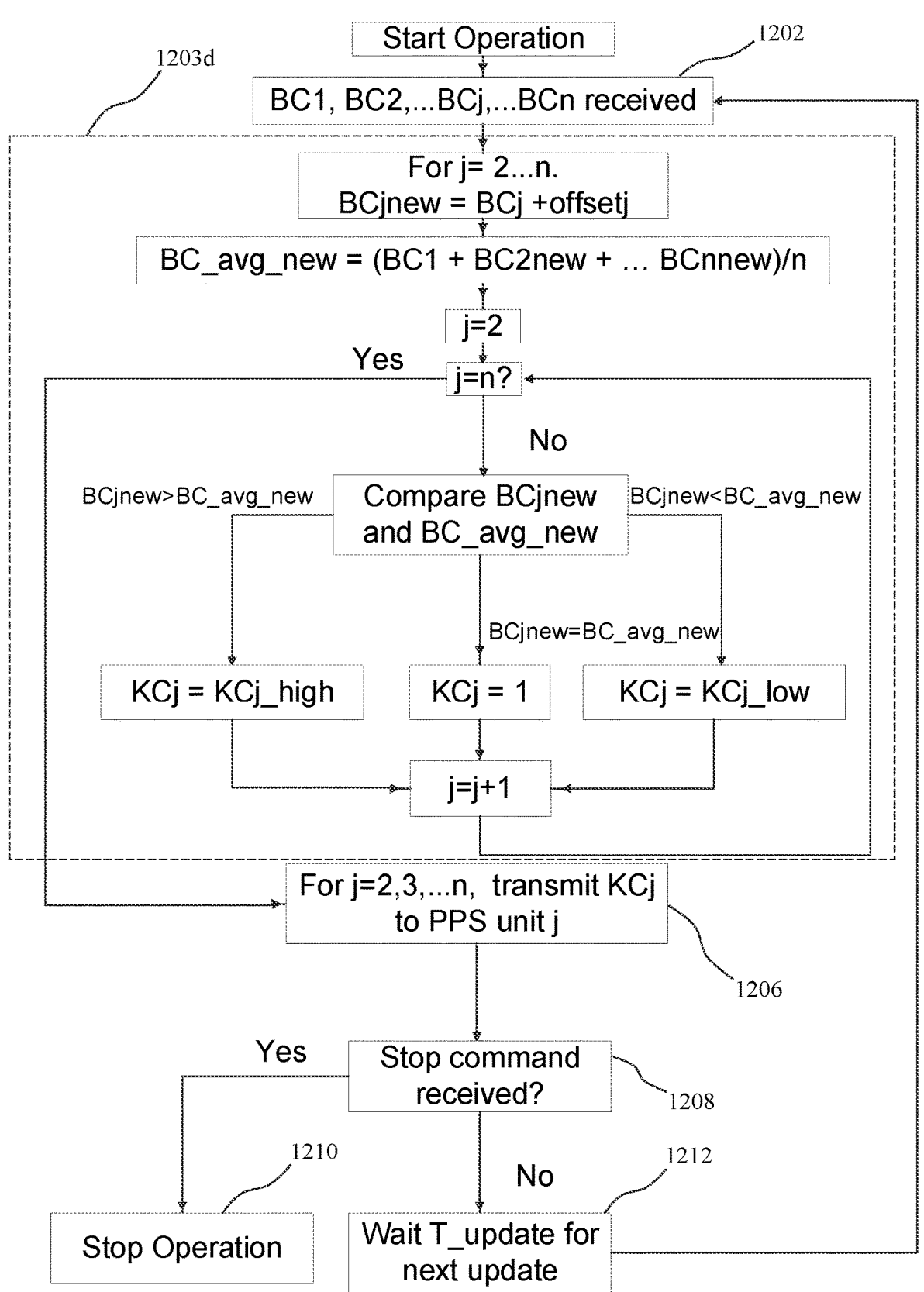
FIG. 12D is a flow chart for a battery balancing and extension controller with n PPS units, according to one embodiment.

The Battery Capacity Controller (BCC) may communicate with each of the PPS units wirelessly, such as by Bluetooth or Wi-Fi, and may include one or more BCC strategy such as one or more of BBC, BXC, and BBXC. As described herein, the BCC may be implemented in an APP running on a remote device as described herein, and the strategy (e.g., BBC, BXC, BBXC) may be selected using the APP. FIGS. 12B, 12C, and 12D are flowcharts for algorithms according to embodiments of BBC, BXC, and BBXC, respectively. In FIGS. 12B, 12C, and 12D, like reference numerals refer to features that are the same or similar.

Referring to FIGS. 12B-12D, at 1202, for every update interval, T_update, the remaining battery capacity of each PPS unit, BCj, (j=1 to n), will be sent to the BCC. Based on the remaining battery capacity, and the selected control strategy, such as BBC, BXC, and BBXC, at 1206 the BCC will send the current control coefficient, KCj, (j=2 to n) to PPS unit j (j=2 to n). For the BBC strategy, FIG. 12B, steps relating to the calculation of KCj are shown at 1203b. Details may be found in the above Example: Battery Balancing Control, four PPS units connected in parallel, which are readily extended to n PPS units connected in parallel.

For the BXC strategy, FIG. 12C, steps relating to the calculation of KCj (KCm) are shown at 1203c. Details may be found in the above Example: Battery Extension Control (BXC), four PPS units connected in parallel, which are readily extended to n PPS units connected in parallel.

For the BBXC strategy, FIG. 12D, steps relating to the calculation of KCj are shown at 1203d. Details may be found in the above Example: Battery Balancing and Extension Control (BBXC), four PPS units connected in parallel, which are readily extended to n PPS units connected in parallel.

For each strategy, the process ends if a stop command 1210 is received at 1208, otherwise it continues at each T_update interval 1212 until the batteries in the PPS units have been depleted.

The inverter output current of PPS unit j (j=2 to n) is controlled by the current control coefficient as the following:

$$Irefj = KCj * Iinj/(j-1), j=2 \text{ to } n \qquad (35)$$

In the above equation, Iinj is the current flowing into the AC input port of unit j. For example, for j=2, 3, 4, 5, the reference current is calculated as:

$$I2 = Iref2 = KC2 * Iin2 = KC\_2 * I1 \qquad (36.1)$$

$$I3 = Iref3 = KC3 * Iin3/2 = KC3 * (I1+I2)/2 \qquad (36.2)$$

$$I4 = Iref4 = KC4 * Iin4/3 = KC4 * (I1+I2+I3)/3 \qquad (36.3)$$

$$I5 = Iref5 = KC5 * Iin5/4 = KC5 * (I1+I2+I3+I4)/4 \qquad (36.4)$$

KCj is a value higher than 1, or lower than 1, or equal to 1 (one).

When it is required that the battery in PPS unit j should be discharged at faster rate, or equivalently it should produce higher output current, KCj is higher than 1.

When it is required that the battery in PPS unit j should be discharged at slower rate, or equivalently it should produce lower output current, KCj is lower than 1.

When it is required that the battery in PPS unit j should be discharged at same rate as other units, or equivalently it should produce same output current, KCj is equal to 1.

For the BXC strategy, FIG. 12C, (1) KCj_high1 is smaller than KCj_high2; (2) the battery in PPS unit n will be depleted first, then the battery in PPS unit n−1 will be depleted, then the battery in PPS unit in n−2 will be depleted, and so on such that the battery in PPS unit 1 will be depleted last; (3) all the PPS units, except the one with its battery to be depleted, will produce substantially the same output current.

As noted above, the current control coefficient KC is used to control the relative value of the output current of a particular PPS unit. In the analysis, it is assumed that instantaneous current control is used, where the output AC current of the PPS unit follows exactly the input current from its AC Input port. Examples of other current control methods that may also be used include but are not limited to the following:

Method 1: The rms value of a previous line cycle of the input current is used as the reference to control the AC output current.

Method 2: The instantaneous value of a previous line cycle of the input current is used as the reference to control the AC output current.

Method 3: The output power of a previous line cycle is used as the reference to control the AC output current.

Method 4: Combination of the previous line cycle value of the input current and previous line cycle of the output current.

Communication Fault Handing Strategy

Figure 13:
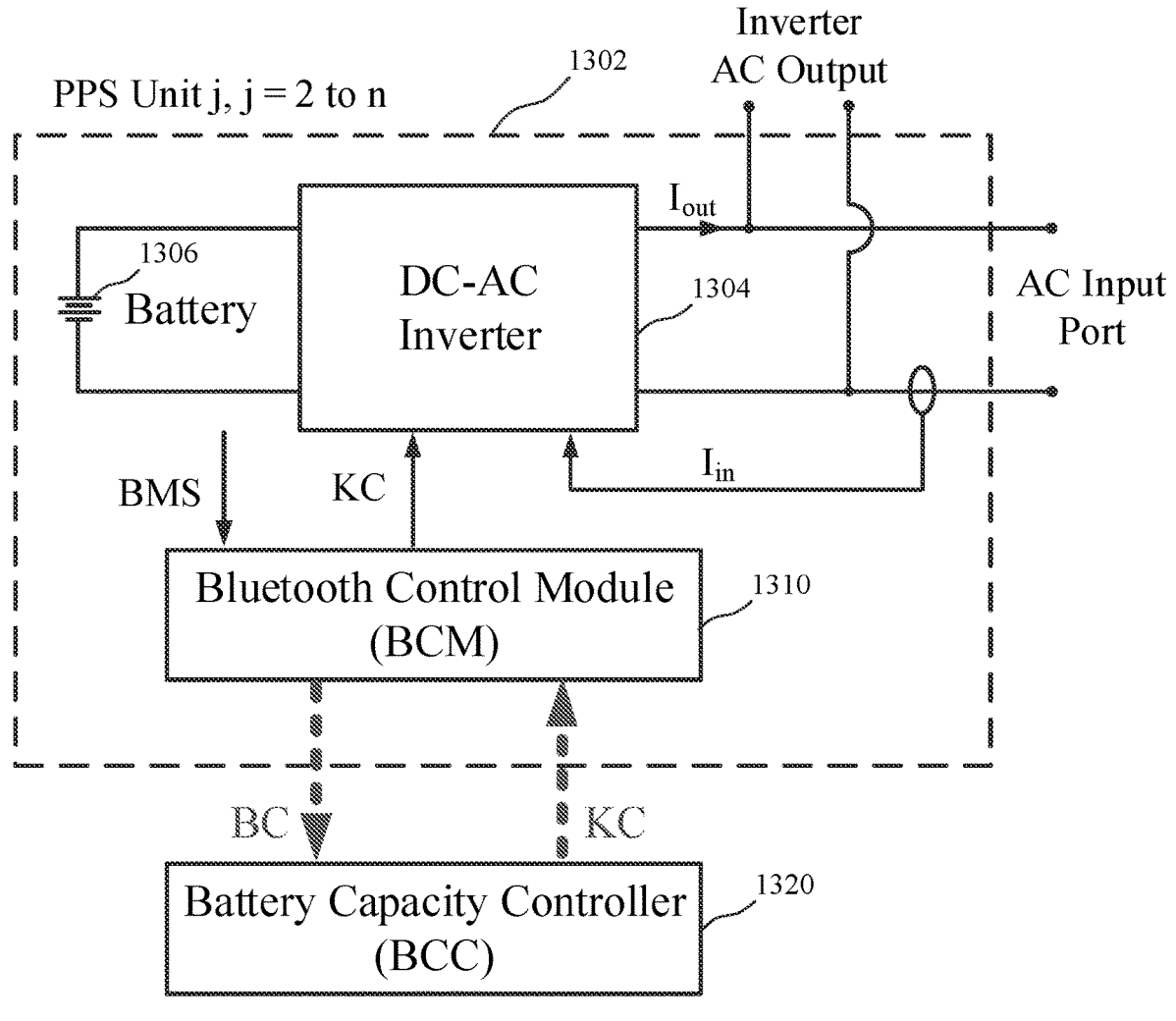
FIG. 13 is a block diagram of a PPS unit j, j=2 to n, with an AC current source output and communication modules for communication with a remote battery capacity controller, according to one embodiment.

FIG. 13 shows a detailed block diagram of PPS unit j, j=2 to n, 1302 with AC current source output. An inverter 1304 converts the battery 1306 voltage to an AC current source, Tout. In all PPS unit embodiments, the battery may be housed within the PPS unit (i.e., an internal battery), or the battery may be external to the PPS unit and connected thereto using a battery connection port, or there may be a combination of internal and external batteries. The input current from the AC input port, Iin, is measured and sent to the DC to AC inverter block 1304 which includes an inverter controller. A communications module 1310 such as a Wi-Fi module or, as shown, a Bluetooth Control Module (BCM) is used for communication with the BCC 1320 running on an external device such as a smart phone, tablet, or computer. Remaining battery capacity BC and optionally other information is determined by a Battery Management System (BMS) of the PPS, which in some embodiments may conveniently be associated with or be part of the DC to AC inverter block 1304.

For every update interval, T_update, the BCM transmits the remaining battery capacity, BC, to the BCC by Bluetooth connection. The BCC will collect the remaining battery capacity of all n PPS units and determine the current control coefficient, KC, for each PPS unit. The value of KC is transmitted from the BCC to the BCM inside the PPS by Bluetooth. The value KC is then transferred to the DC to AC inverter block. The output current, Tout, of each PPS unit will be determined by Iin and KC, depending on the control strategy selected, as discussed above. For unit j, $$Ij = Trefj = KCj * Iinj/(j-1) \qquad (37)$$

In some embodiments, the BCC is an APP running on a cell phone. It is possible that the cell phone may be moved away from the PPS units, or the Bluetooth function of the cell phone is turned off, or the battery of the cell phone is depleted. Under all these conditions, a communication fault has happened and no communication between PPS unit and BCC is available. The communication fault can be detected by each PPS unit when its communication with BCC is not available.

Under the communication fault condition, one or more of the following actions may be taken:

Action 1: Each PPS will use the most recent KC value to control its output current.

Action 2: Each PPS will set KC=1 when communication fault is identified.

Action 3: The PPS will shut down.

Action 4: An error indicator such as a LED may be flagged in the PPS units.

Action 5: An error indication may be flagged in the APP to warn the user that the cell phone and PPS communication is broken.

From a practical point of view, it is desired to revert the operation to current sharing mode when the BCC is disconnected from the PPS units. Therefore, it is desired to set KC=1 when the BCM has identified that the communication between PPS unit and BCC is lost.

Under the communication fault condition, the BCM may continue sending remaining battery capacity information to the BCC and wait for the current control coefficient (KC) information.

The same or similar actions my of course be implemented for other communications methods, such as Wi-Fi.

All cited publications are incorporated herein by reference in their entirety.

EQUIVALENTS

It will be appreciated that modifications may be made to the embodiments described herein without departing from the scope of the invention. Accordingly, the invention should not be limited by the specific embodiments set forth but should be given the broadest interpretation consistent with the teachings of the description as a whole.

The invention claimed is:

1. A portable power station (PPS) apparatus, comprising:
    two or more PPS units, the two or more PPS units connected together in a parallel arrangement to produce a total output current, wherein a first PPS unit operates as a voltage source and each of a second or more PPS unit operates as a current source;
    a battery capacity controller (BCC);
    wherein each PPS unit of the two or more PPS units is configured to communicate with the BCC;
    wherein each PPS transmits information including a battery capacity measure to the BCC at selected time intervals;
    wherein the BCC uses the battery capacity measure of each PPS unit to implement a selected battery capacity control strategy that determines the amount of output current each of the second or more PPS unit contributes to the total output current at each selected time interval; and
    the BCC transmits a control coefficient to each of the second or more PPS units corresponding to the determined amount of output current to be produced by each of the second or more PPS units.

2. The PPS apparatus of claim 1, wherein the BCC is implemented at least in part in computer-executable instructions stored on non-transitory computer-readable storage media.

3. The PPS apparatus of claim 2, wherein the BCC is implemented on a remote processing device that executes the computer-executable instructions stored on non-transitory computer-readable storage media.

4. The PPS apparatus of claim 3, wherein transmission of information from each PPS to the BCC and transmission of the control coefficient from the BCC to each PPS is performed wirelessly.

5. The PPS apparatus of claim 4, wherein the wireless transmission comprises Bluetooth or Wi-Fi.

6. The PPS apparatus of claim 1, wherein the BCC implements at least one battery capacity control strategy selected from a battery balancing controller (BBC), a battery extension controller (BXC), and a battery balancing and extension controller (BBXC).

7. The PPS apparatus of claim 6, wherein the battery capacity control strategy is selectable.

8. The PPS apparatus of claim 1, wherein the output current of a selected one of the second or more PPS units is controlled to be higher than, lower than, or equal to an average output current of all the PPS units.

9. The PPS apparatus of claim 1, wherein a battery capacity of each PPS unit is substantially the same at a selected time interval.

10. The PPS apparatus of claim 1, wherein a battery capacity of a selected PPS unit is depleted before the battery capacity of remaining PPS units is depleted.

11. The PPS apparatus of claim 1, wherein the battery capacities of each of the two or more PPS units are maintained according to a pre-determined relationship.

12. A method for controlling a portable power station (PPS) apparatus, wherein the PPS apparatus comprises two or more PPS units, the two or more PPS units connected together in a parallel arrangement to produce a total output current, wherein a first PPS unit operates as a voltage source and each of a second or more PPS unit operates as a current source, the method comprising:

implementing a battery capacity controller (BCC) as a processing device;

transmitting information including a battery capacity measure from each PPS unit to the BCC at selected time intervals;

the BCC using the battery capacity measure of each PPS unit to implement a selected battery capacity control strategy that determines the amount of output current each of the second or more PPS unit contributes to the total output current at each selected time interval; and the BCC transmitting a control coefficient to each of the second or more PPS units corresponding to the determined amount of output current to be produced by each of the second or more PPS units.

13. The method of claim 12, wherein the BCC is implemented at least in part in computer-executable instructions stored on non-transitory computer-readable storage media.

14. The method of claim 12, wherein the BCC implements at least one battery capacity control strategy selected from a battery balancing controller (BBC), a battery extension controller (BXC), and a battery balancing and extension controller (BBXC).

15. The method of claim 14, wherein the battery capacity control strategy is selectable.

16. The method of claim 12, wherein the output current of a selected one of the second or more PPS units is controlled to be higher than, lower than, or equal to an average output current of all the PPS units according to the selected battery capacity control strategy.

17. The method of claim 12, wherein a battery capacity of each PPS unit is substantially the same at a selected time interval.

18. The method of claim 12, wherein a battery capacity of a selected PPS unit is depleted before the battery capacity of remaining PPS units is depleted.

19. The method of claim 12, wherein the battery capacities of each of the two or more PPS units are maintained according to a pre-determined relationship.

\*    \*    \*    \*    \*